(12) United States Patent
Rofougaran

(10) Patent No.: US 7,787,849 B2
(45) Date of Patent: *Aug. 31, 2010

(54) POWER CONSUMPTION MANAGEMENT BASED ON RECEIVER PARAMETER AND METHOD FOR USE THEREWITH

(75) Inventor: Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 571 days.

This patent is subject to a terminal disclaimer.

(21) Appl. No.: 11/848,527

(22) Filed: Aug. 31, 2007

(65) Prior Publication Data

US 2009/0061798 A1    Mar. 5, 2009

(51) Int. Cl.
*H04B 7/00*    (2006.01)
*H04B 17/02*    (2006.01)

(52) U.S. Cl. .................. 455/245.1; 455/136; 455/138

(58) Field of Classification Search .................. 455/136, 455/138, 127.2, 232.1, 239.2, 240.1, 245.1, 455/522
See application file for complete search history.

(56) References Cited

U.S. PATENT DOCUMENTS

| | | | |
|---|---|---|---|
| 6,804,501 B1 * | 10/2004 | Bradley et al. | 455/138 |
| 7,248,890 B1 * | 7/2007 | Raghavan et al. | 455/522 |
| 2007/0099591 A1 * | 5/2007 | Hendrix et al. | 455/343.1 |
| 2009/0059825 A1 * | 3/2009 | Rofougaran | 370/311 |
| 2009/0061800 A1 * | 3/2009 | Rofougaran | 455/136 |
| 2009/0061919 A1 * | 3/2009 | Rofougaran | 455/522 |
| 2009/0068968 A1 * | 3/2009 | Rofougaran | 455/136 |
| 2009/0081972 A1 * | 3/2009 | Rofougaran | 455/127.1 |
| 2009/0131095 A1 * | 5/2009 | Rofougaran | 455/522 |

* cited by examiner

*Primary Examiner*—Sonny Trinh
(74) *Attorney, Agent, or Firm*—Garlick Harrison & Markison; Bruce E. Stuckman

(57) ABSTRACT

An integrated circuit (IC) includes an RF receiver having an AGC module that generates an automatic gain control (AGC) signal based on a strength of a received signal, and a low noise amplifier that amplifies the received signal based on the AGC signal. A processing module generates a power mode signal based on the AGC signal, the power mode signal for adjusting a power consumption parameter of the IC based on the power mode signal.

23 Claims, 20 Drawing Sheets

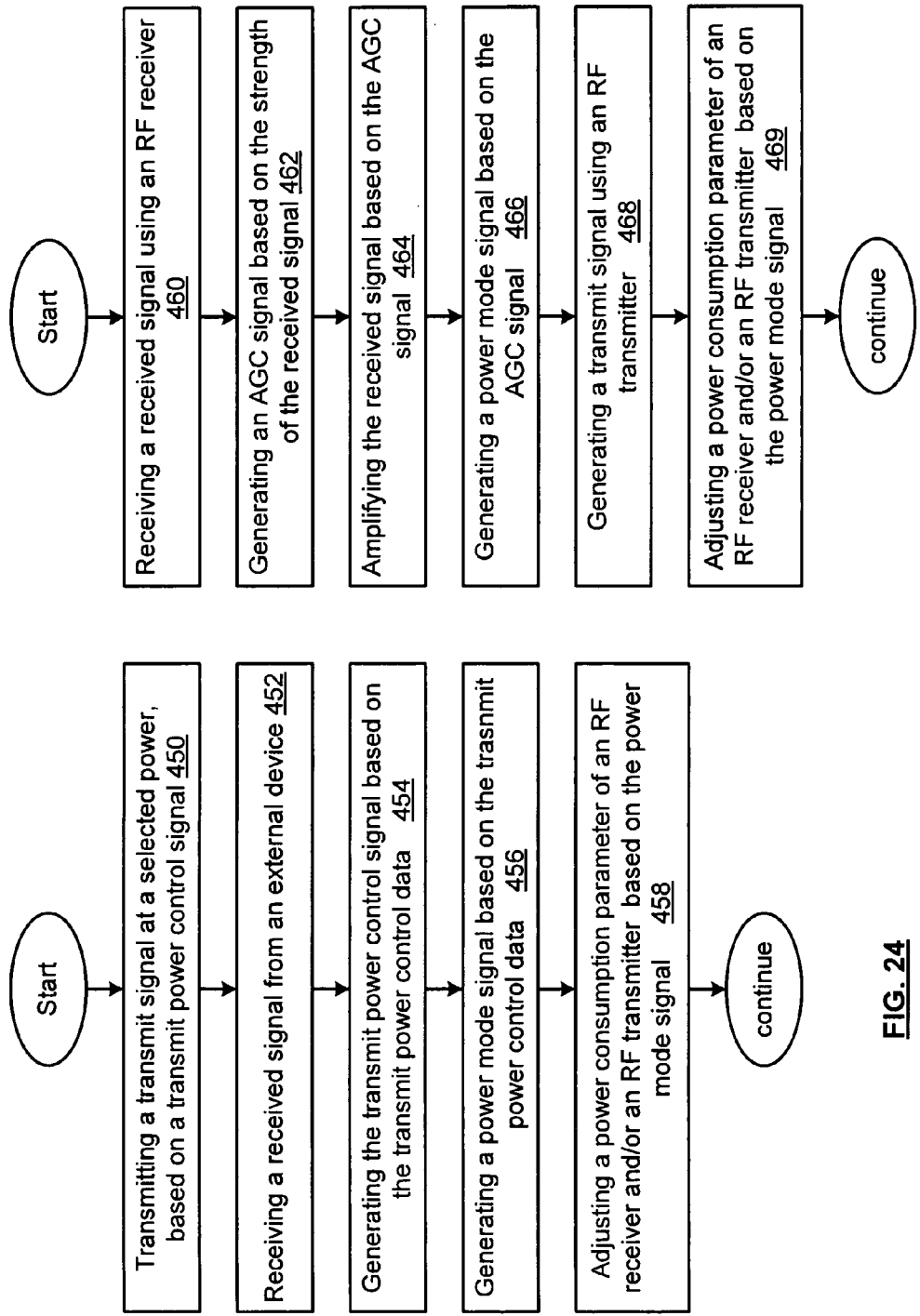

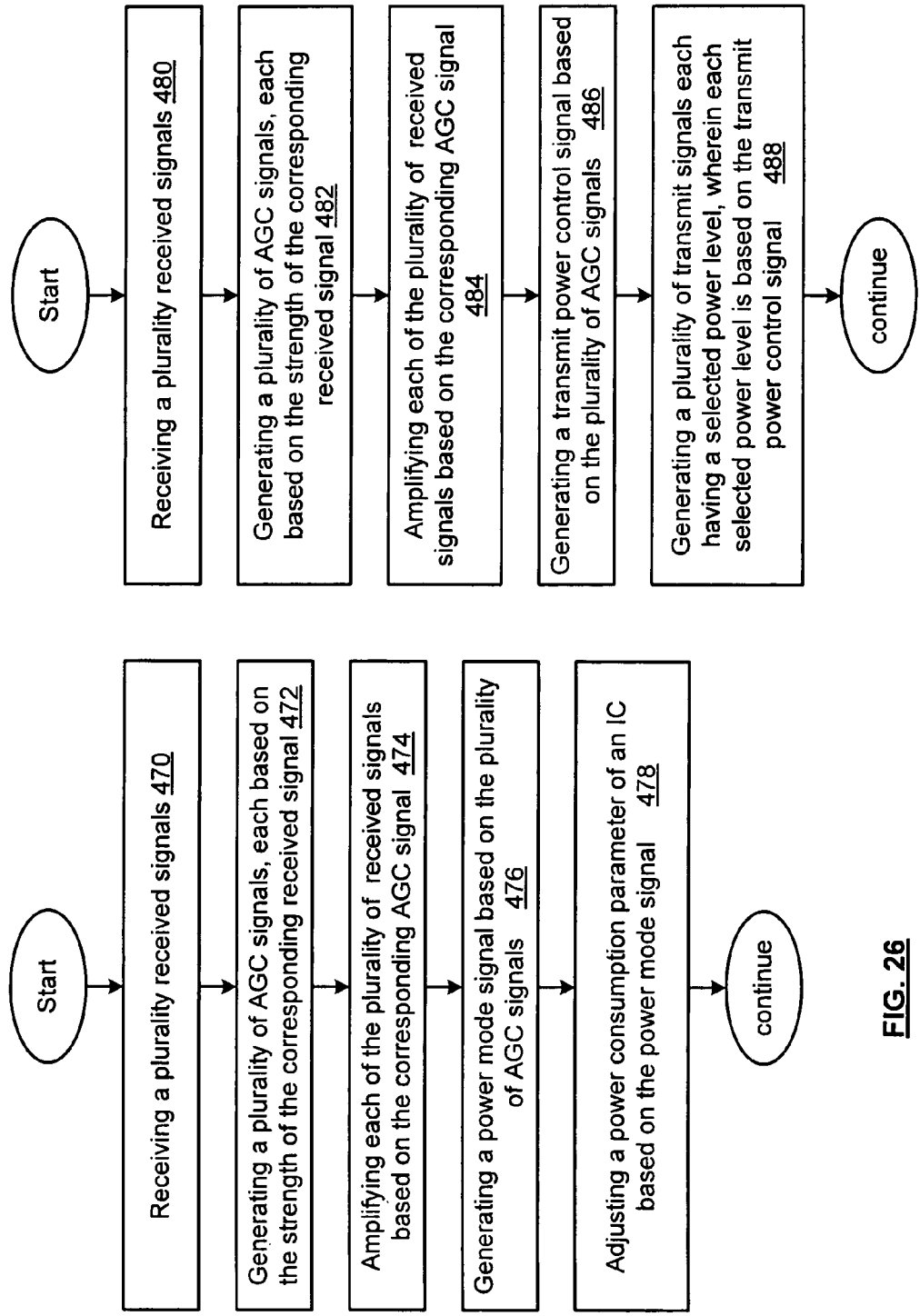

US 7,787,849 B2

POWER CONSUMPTION MANAGEMENT BASED ON RECEIVER PARAMETER AND METHOD FOR USE THEREWITH

CROSS REFERENCE TO RELATED APPLICATIONS

The present application is related to the following applications:

TRANSMIT POWER MANAGEMENT BASED ON RECEIVER PARAMETER AND METHOD FOR USE THEREWITH, having Ser. No. 11/847,533, filed on Aug. 30, 2007;

POWER CONSUMPTION MANAGEMENT BASED ON TRANSMIT POWER CONTROL DATA AND METHOD FOR USE THEREWITH, having Ser. No. 11/849,424, filed on Sep. 4, 2007;

MULTI-INPUT MULTI-OUTPUT TRANSCEIVER WITH POWER CONSUMPTION MANAGEMENT BASED ON RECEIVER PARAMETER AND METHOD FOR USE THEREWITH, having Ser. No. 11/850,114, filed on Sep. 5, 2007;

MULTI-INPUT MULTI-OUTPUT TRANSCEIVER WITH TRANSMIT POWER MANAGEMENT BASED ON RECEIVER PARAMETER AND METHOD FOR USE THEREWITH, having Ser. No. 11/850,808, filed on Sep. 6, 2007;

The contents of which are incorporated herein by reference thereto.

BACKGROUND OF THE INVENTION

1. Technical Field of the Invention

This invention relates generally to mobile communication devices and more particularly to a circuit for managing power in an RF integrated circuit.

2. Description of Related Art

As is known, integrated circuits are used in a wide variety of products including, but certainly not limited to, portable electronic devices, computers, computer networking equipment, home entertainment, automotive controls and features, and home appliances. As is also known, integrated circuits include a plurality of circuits in a very small space to perform one or more fixed or programmable functions.

Power management can be an important consideration for electronic devices, particularly for mobile devices that operate from battery power. Lowering the power consumption of a device can increase battery life, or conversely, can potentially decrease the size of the battery that is required, with a corresponding decrease in weight and size.

The advantages of the present invention will be apparent to one skilled in the art when presented with the disclosure herein.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

FIG. 24 is a flow chart of an embodiment of a method in accordance with the present invention;

FIG. 25 is a flow chart of an embodiment of a method in accordance with the present invention;

FIG. 26 is a flow chart of an embodiment of a method in accordance with the present invention; and FIG. 27 is a flow chart of an embodiment of a method in accordance with the present invention.

DETAILED DESCRIPTION OF THE INVENTION

Figure 1:
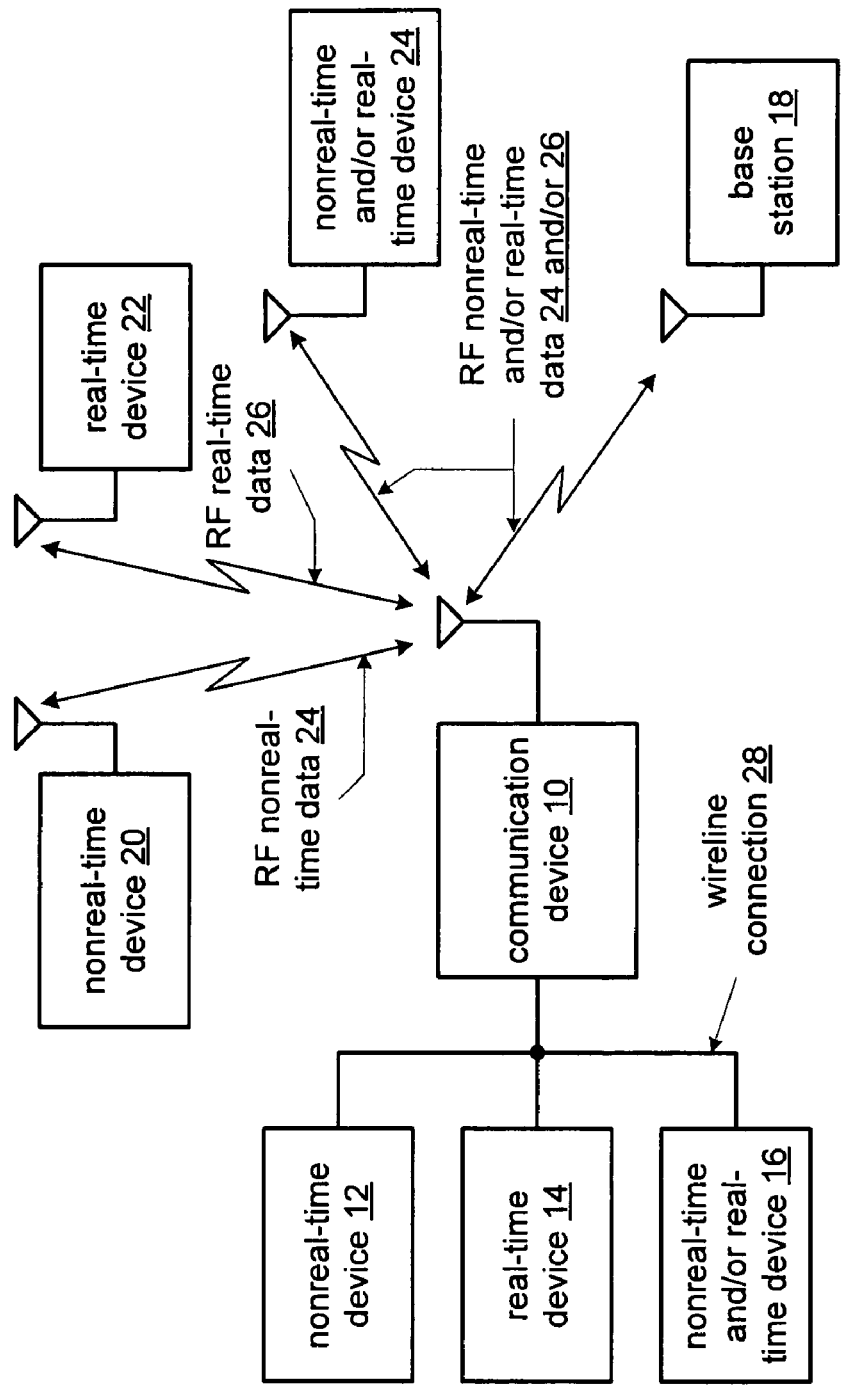
FIG. 1 is a schematic block diagram of an embodiment of a communication system in accordance with the present invention.

FIG. 1 is a schematic block diagram of an embodiment of a communication system in accordance with the present invention. In particular a communication system is shown that includes a communication device 10 that communicates real-time data 24 and/or non-real-time data 26 wirelessly with one or more other devices such as base station 18, non-real-time device 20, real-time device 22, and non-real-time and/or real-time device 24. In addition, communication device 10 can also optionally communicate over a wireline connection with non-real-time device 12, real-time device 14, non-real-time and/or real-time device 16.

In an embodiment of the present invention the wireline connection 28 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as IEEE 802.11, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 10.

Communication device 10 can be a mobile phone such as a cellular telephone, a personal digital assistant, game console, personal computer, laptop computer, or other device that performs one or more functions that include communication of voice and/or data via wireline connection 28 and/or the wireless communication path. In an embodiment of the present invention, the real-time and non-real-time devices 12, 14 16, 18, 20, 22 and 24 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 26 includes voice, audio, video and multimedia applications including Internet gaming, etc. The non-real-time data 24 includes text messaging, email, web browsing, file uploading and downloading, etc.

In an embodiment of the present invention, the communication device 10 includes an integrated circuit, such as a combined voice, data and RF integrated circuit that includes one or more features or functions of the present invention. Such integrated circuits shall be described in greater detail in association with FIGS. 3-27 that follow.

Figure 2:
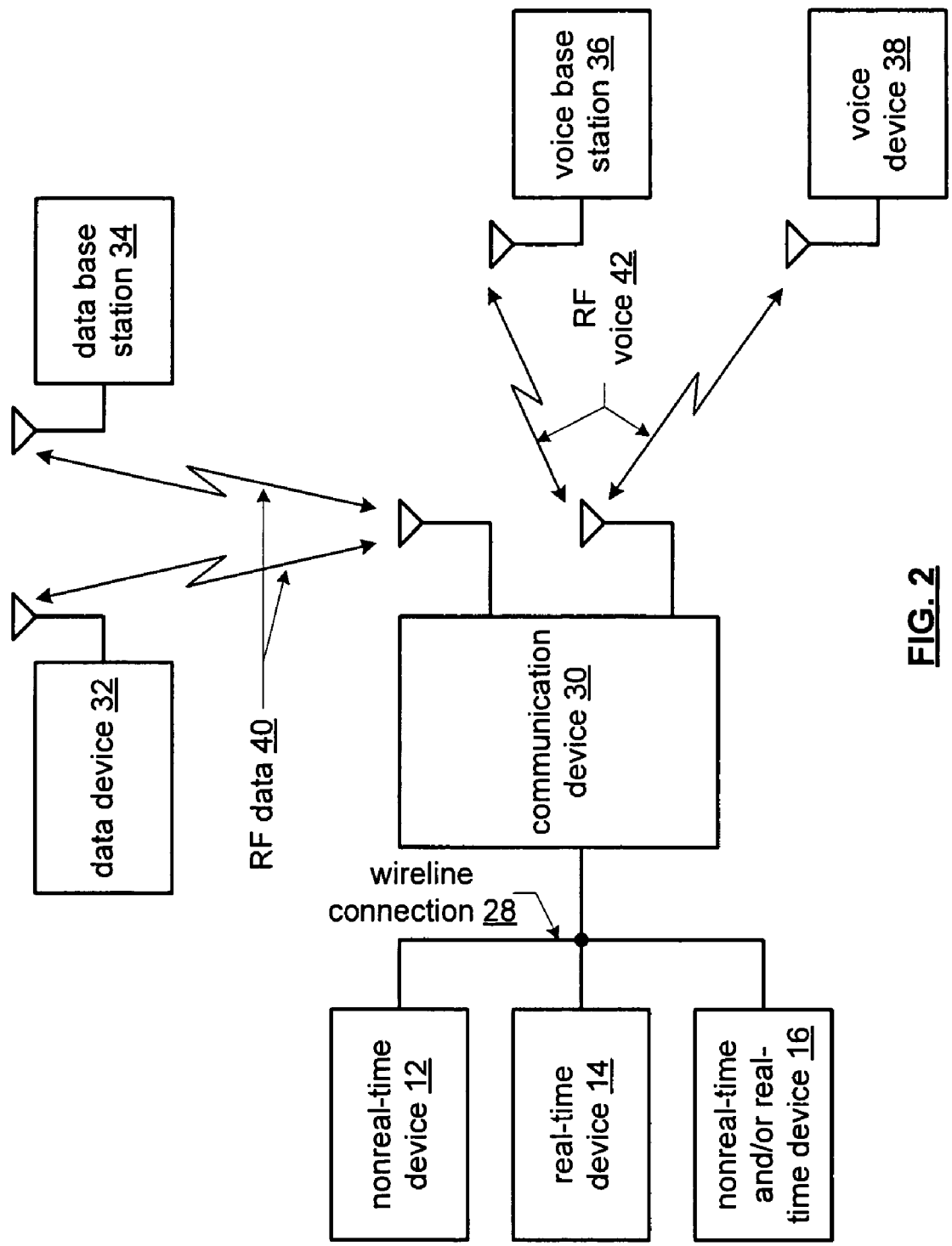
FIG. 2 is a schematic block diagram of an embodiment of another communication system in accordance with the present invention.

FIG. 2 is a schematic block diagram of an embodiment of another communication system in accordance with the present invention. In particular, FIG. 2 presents a communication system that includes many common elements of FIG. 1 that are referred to by common reference numerals. Communication device 30 is similar to communication device 10 and is capable of any of the applications, functions and features attributed to communication device 10, as discussed in conjunction with FIG. 1. However, communication device 30 includes two separate wireless transceivers for communicating, contemporaneously, via two or more wireless communication protocols with data device 32 and/or data base station 34 via RF data 40 and voice base station 36 and/or voice device 38 via RF voice signals 42.

Figure 3:
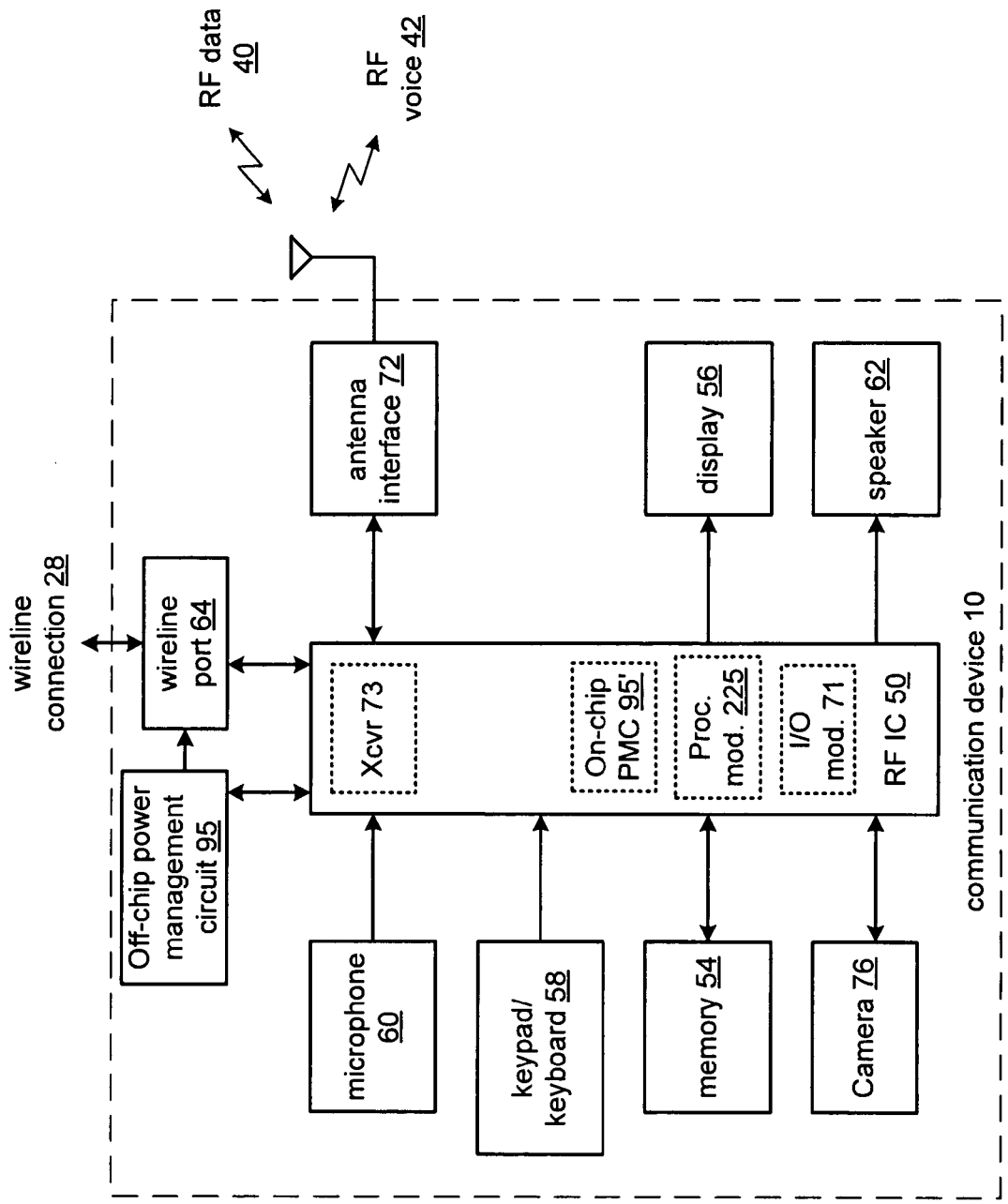
FIG. 3 is a schematic block diagram of an embodiment of an integrated circuit in accordance with the present invention.

FIG. 3 is a schematic block diagram of an embodiment of an integrated circuit in accordance with the present invention. In particular, an RF integrated circuit (IC) 50 is shown that implements communication device 10 in conjunction with microphone 60, keypad/keyboard 58, memory 54, speaker 62, display 56, camera 76, antenna interface 52 and wireline port 64. In addition, RF IC 50 includes a transceiver 73 with RF and baseband modules for formatting and modulating data into RF real-time data 26 and non-real-time data 24 and transmitting this data via an antenna interface 72 and an antenna. Further, RF IC 50 includes an input/output module 71 with appropriate encoders and decoders for communicating via the wireline connection 28 via wireline port 64, an optional memory interface for communicating with off-chip memory 54, a codec for encoding voice signals from microphone 60 into digital voice signals, a keypad/keyboard interface for generating data from keypad/keyboard 58 in response to the actions of a user, a display driver for driving display 56, such as by rendering a color video signal, text, graphics, or other display data, and an audio driver such as an audio amplifier for driving speaker 62 and one or more other interfaces, such as for interfacing with the camera 76 or the other peripheral devices.

Off-chip power management circuit 95 includes one or more DC-DC converters, voltage regulators, current regulators or other power supplies for supplying the RF IC 50 and optionally the other components of communication device 10 and/or its peripheral devices with supply voltages and or currents (collectively power supply signals) that may be required to power these devices. Off-chip power management circuit 95 can operate from one or more batteries, line power and/or from other power sources, not shown. In particular, off-chip power management module can selectively supply power supply signals of different voltages, currents or current limits or with adjustable voltages, currents or current limits in response to power mode signals received from the RF IC 50. RF IC 50 optionally includes an on-chip power management circuit 95' for replacing the off-chip power management circuit 95.

In an embodiment of the present invention, the RF IC 50 is a system on a chip integrated circuit that includes at least one processing device. Such a processing device, for instance, processing module 225, may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip such as memory 54. Such a memory device may be a read-only memory, random access memory, volatile memory, non-volatile memory, static memory, dynamic memory, flash memory, and/or any device that stores digital information. Note that when the processing module 225 implements one or more of its functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

In operation, the RF IC 50 executes operational instructions that implement one or more of the applications (real-time or non-real-time) attributed to communication devices 10 and 30 as discussed in conjunction with FIGS. 1 and 2. Further, RF IC 50 includes power management features in accordance with the present invention that will be discussed in greater detail in association with FIGS. 5-27.

Figure 4:
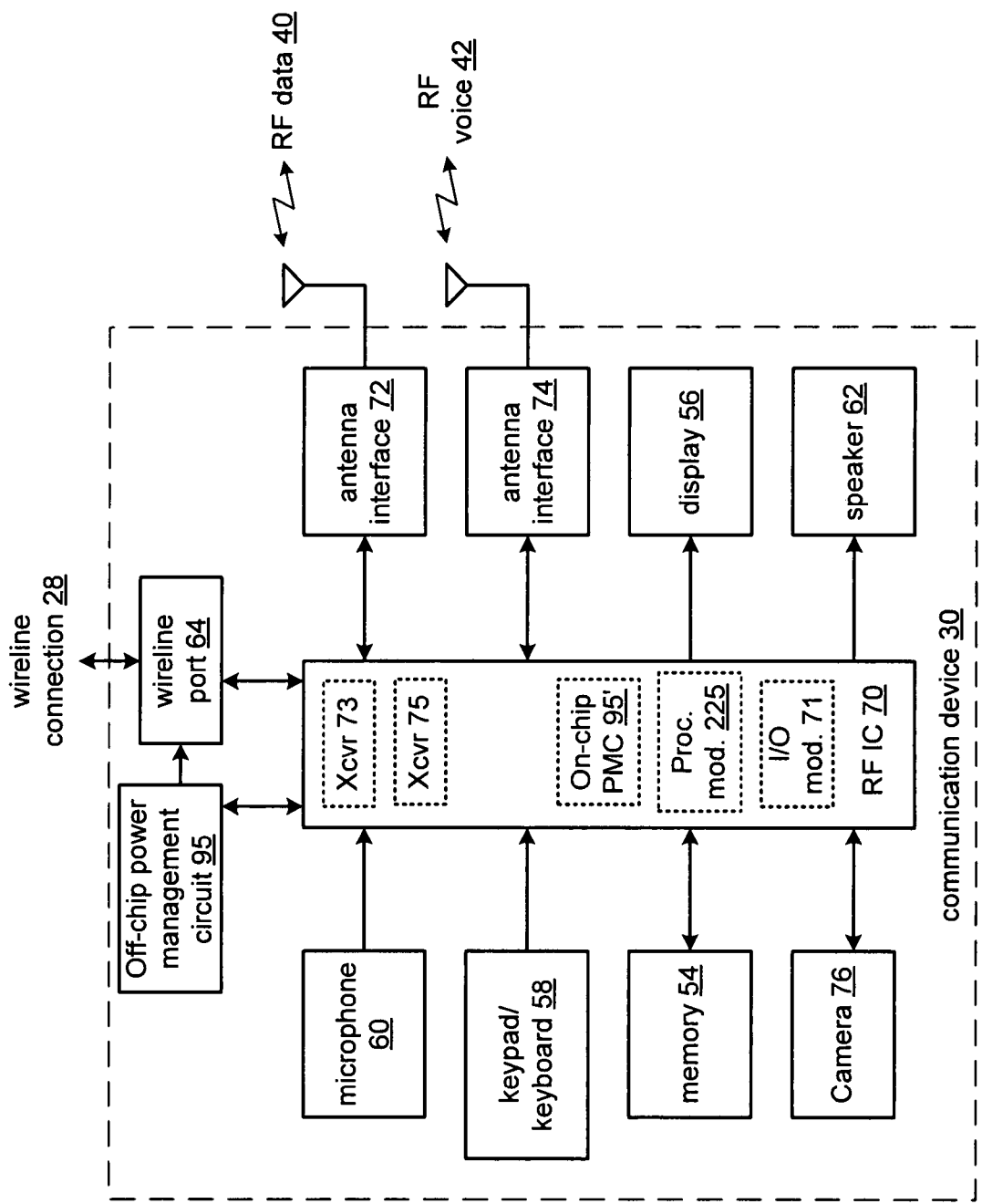
FIG. 4 is a schematic block diagram of another embodiment of an integrated circuit in accordance with the present invention.

FIG. 4 is a schematic block diagram of another embodiment of an integrated circuit in accordance with the present invention. In particular, FIG. 4 presents a communication device 30 that includes many common elements of FIG. 3 that are referred to by common reference numerals. RF IC 70 is similar to RF IC 50 and is capable of any of the applications, functions and features attributed to RF IC 50 as discussed in conjunction with FIG. 3. However, RF IC 70 includes two separate wireless transceivers 73 and 75 for communicating, contemporaneously, via two or more wireless communication protocols via RF data 40 and RF voice signals 42.

In operation, the RF IC 70 executes operational instructions that implement one or more of the applications (real-time or non-real-time) attributed to communication device 10 as discussed in conjunction with FIG. 1. Further, RF IC 70 includes power management features in accordance with the present invention that will be discussed in greater detail in association with FIGS. 5-27.

Figure 5:
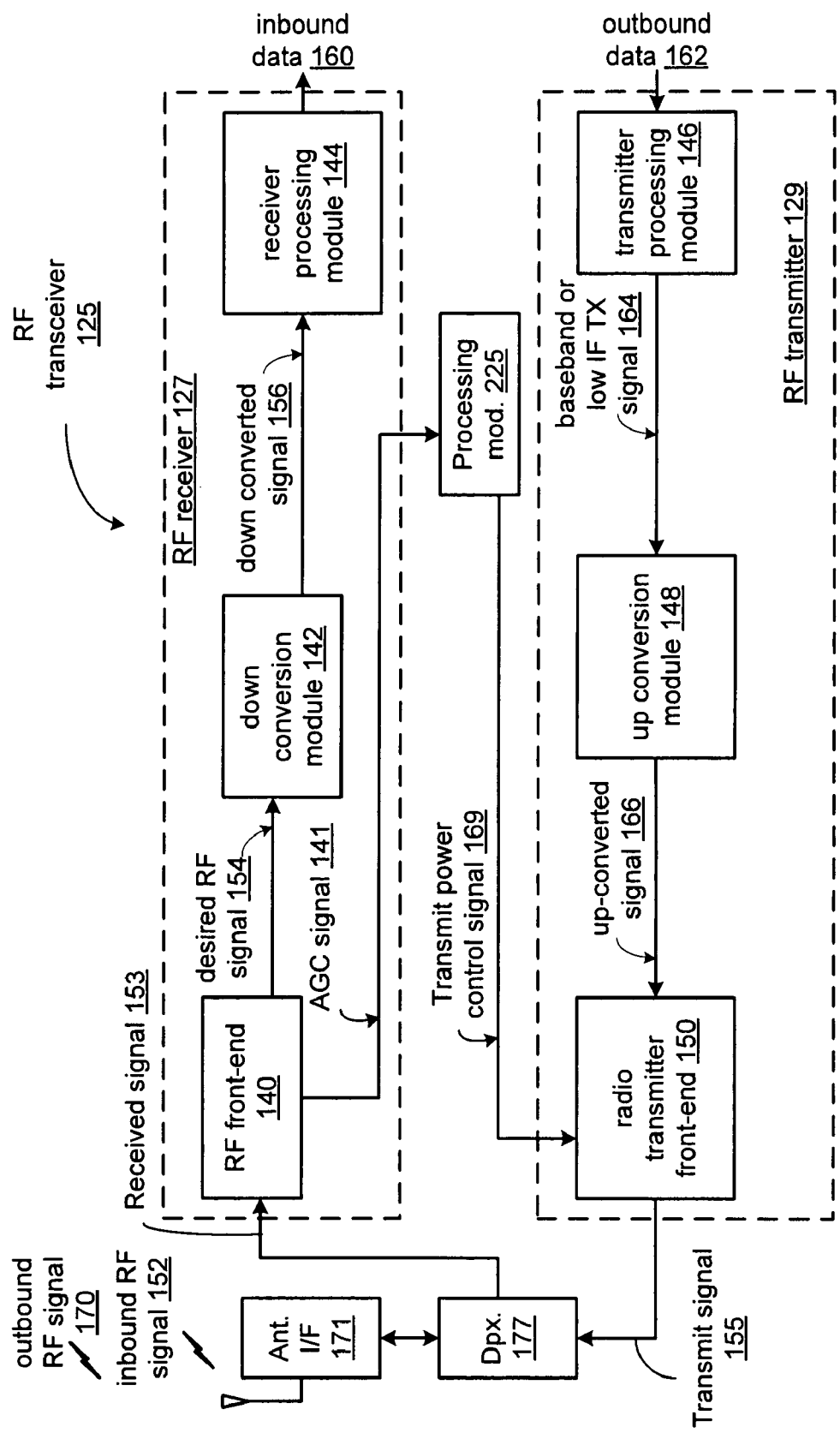
FIG. 5 is a schematic block diagram of an embodiment of an RF transceiver in accordance with the present invention.

FIG. 5 is a schematic block diagram of an RF transceiver 125, such as transceiver 73 or 75, which may be incorporated in communication devices 10 and/or 30. The RF transceiver 125 includes an RF transmitter 129, an RF receiver 127 that operate in accordance with a wireless local area network protocol, a pico area network protocol, a wireless telephony protocol, a wireless data protocol, or other protocol. The RF receiver 127 includes a RF front end 140, a down conversion module 142, and a receiver processing module 144. The RF transmitter 129 includes a transmitter processing module 146, an up conversion module 148, and a radio transmitter front-end 150.

As shown, the receiver and transmitter are each coupled to an antenna through an off-chip antenna interface 171 and a diplexer (duplexer) 177, that couples the transmit signal 155 to the antenna to produce outbound RF signal 170 and couples inbound RF signal 152 to produce received signal 153. While a single antenna is represented, the receiver and transmitter may each employ separate antennas or share a multiple antenna structure that includes two or more antennas. In another embodiment, the receiver and transmitter may share a multiple input multiple output (MIMO) antenna structure that includes a plurality of antennas. Each antenna may be fixed, programmable, an antenna array or other antenna configuration. Accordingly, the antenna structure of the wireless transceiver will depend on the particular standard(s) to which the wireless transceiver is compliant and the applications thereof.

In operation, the transmitter receives outbound data 162 from a host device or other source via the transmitter processing module 146. The transmitter processing module 146 processes the outbound data 162 in accordance with a particular wireless communication standard (e.g., IEEE 802.11, Bluetooth, RFID, GSM, CDMA, et cetera) to produce baseband or low intermediate frequency (IF) transmit (TX) signals 164. The baseband or low IF TX signals 164 may be digital baseband signals (e.g., have a zero IF) or digital low IF signals, where the low IF typically will be in a frequency range of one hundred kilohertz to a few megahertz. Note that the processing performed by the transmitter processing module 146 includes, but is not limited to, scrambling, encoding, puncturing, mapping, modulation, and/or digital baseband to IF conversion. Further note that the transmitter processing module 146 may be implemented using a shared processing device, individual processing devices, or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module 146 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

The up conversion module 148 includes a digital-to-analog conversion (DAC) module, a filtering and/or gain module, and a mixing section. The DAC module converts the baseband or low IF TX signals 164 from the digital domain to the analog domain. The filtering and/or gain module filters and/or adjusts the gain of the analog signals prior to providing it to the mixing section. The mixing section converts the analog baseband or low IF signals into up converted signals 166 based on a transmitter local oscillation 168.

The radio transmitter front end 150 includes a power amplifier and may also include a transmit filter module. The power amplifier amplifies the up converted signals 166 to produce outbound RF signals 170, which may be filtered by the transmitter filter module, if included. The antenna structure transmits the outbound RF signals 170 to a targeted device such as a RF tag, base station, an access point and/or another wireless communication device via an antenna interface 171 coupled to an antenna that provides impedance matching and optional bandpass filtration.

The receiver receives inbound RF signals 152 via the antenna and off-chip antenna interface 171 that operates to process the inbound RF signal 152 into received signal 153 for the receiver front-end 140. In general, antenna interface 171 provides impedance matching of antenna to the RF front-end 140 and optional bandpass filtration of the inbound RF signal 152.

The down conversion module 70 includes a mixing section, an analog to digital conversion (ADC) module, and may also include a filtering and/or gain module. The mixing section converts the desired RF signal 154 into a down converted signal 156 that is based on a receiver local oscillation 158, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 156. Note that the ordering of the ADC module and filtering and/or gain module may be switched, such that the filtering and/or gain module is an analog module.

The receiver processing module 144 processes the baseband or low IF signal 156 in accordance with a particular wireless communication standard (e.g., IEEE 802.11, Bluetooth, RFID, GSM, CDMA, et cetera) to produce inbound data 160. The processing performed by the receiver processing module 144 can include, but is not limited to, digital intermediate frequency to baseband conversion, demodulation, demapping, depuncturing, decoding, and/or descrambling. Note that the receiver processing modules 144 may be implemented using a shared processing device, individual processing devices, or a plurality of processing devices and may further include memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the receiver processing module 144 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, processing module 225 generates a transmit power control signal 169 based on an AGC signal 141 from receiver front-end 140. RF transmitter 129, in turn, generates a transmit signal 155 having a selected power level, wherein the selected power level is based on the transmit power control signal 169. If, for instance, RF transceiver 125 is communicating with an external device and is receiving an inbound RF signal 152 with high signal strength, the strength of received signal 153 will generate an AGC signal 141 that controls the gain of the RF front-end lower and that can be used by processing module 255, via transmit power control signal 169, to select a lower power level for transmit signal 155. This can conserve power and possibly battery life, when the device that incorporates RF transceiver 125 is a mobile communication device, and can help reduce interference for other stations in range of RF transceiver 125 that may be communicating with the same access point or base station or that may otherwise be using the same spectrum.

Similarly, if for instance, RF transceiver 125 is communicating with an external device and is receiving an inbound RF signal 152 with low signal strength, the strength of received signal 153 will generate an AGC signal 141 that controls the gain of the RF front-end higher and that can be used by processing module 255, via transmit power control signal 169, to select a higher power level for transmit signal 155.

This can help outbound RF signal 170 reach an external device that may be distant, or that has an obstructed communication path to RF transceiver 125.

In an embodiment of the present invention, the processing module 225 adjusts the transmit power control signal 169 based on the AGC signal 141. For instance, the processing module 225 can include hardware, firmware or software that, via a look-up table or algorithm, generates a transmit power control signal 169 corresponding to a desired power level based on the value of the AGC signal 141. In particular, RF transmitter 129 may be capable of operating at one of a plurality of power levels (such as low, medium, high or a greater number of levels), and the processing module 225 can generate the transmit power control signal by comparing the AGC signal to a corresponding plurality of thresholds to control the transmit power in accordance with the received signal strength.

In addition, the processing module 225 can include a filter or use other filtration to generate a filtered AGC signal and to adjust the transmit power control signal 169 in response to the filtered AGC signal. In this situation, the transmit power can be controlled to adjust to slower changes in the AGC signal to avoid rapid fluctuations in the received signal.

Figure 6:
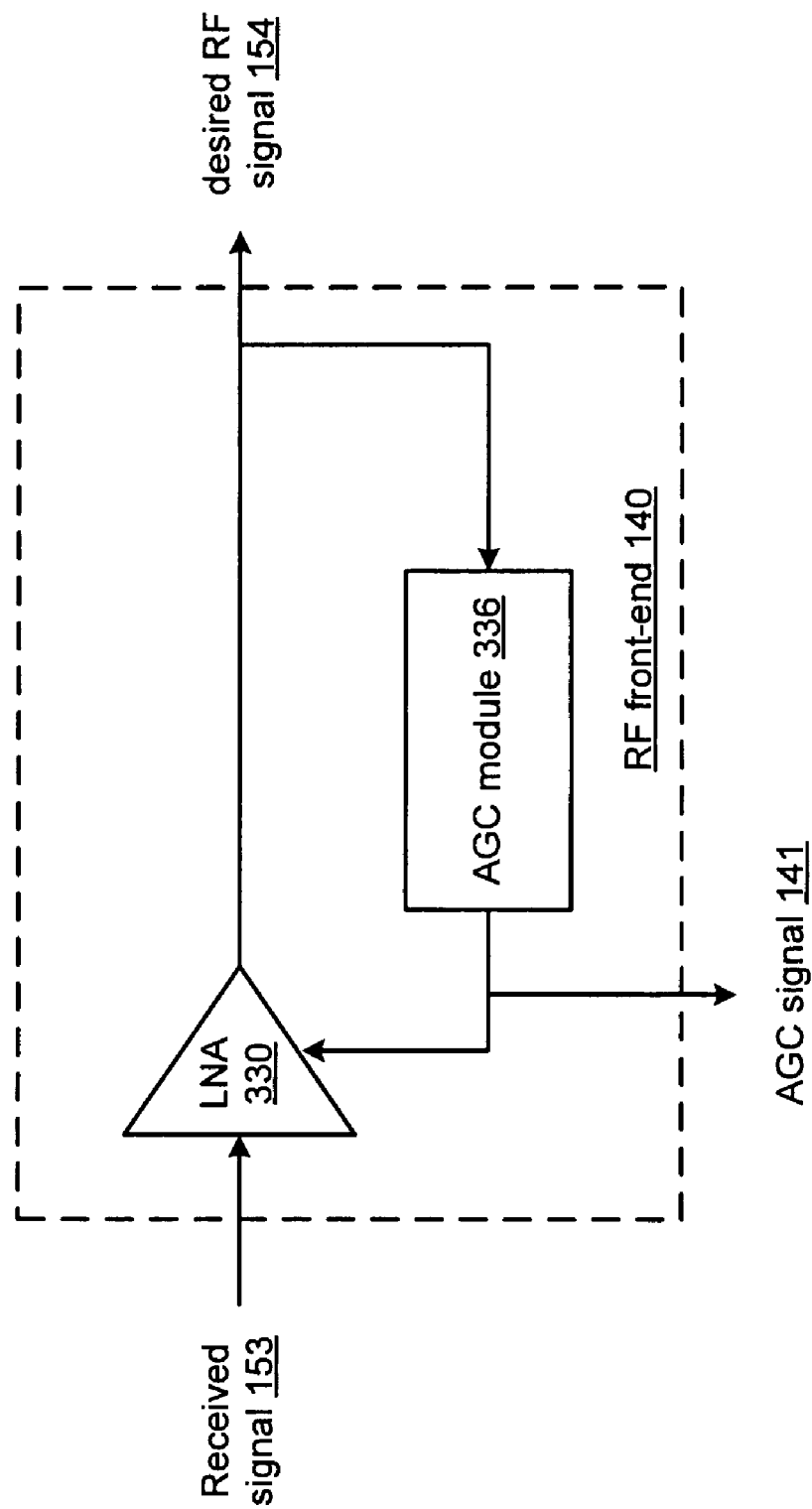
FIG. 6 is a schematic block diagram of an embodiment of an RF front end in accordance with the present invention.

FIG. 6 is a schematic block diagram of an embodiment of an RF front end in accordance with the present invention. In particular, RF front end 140 includes an AGC module 336 that generates an automatic gain control (AGC) signal 141 based on a strength of the received signal 153 and a low noise amplifier 330, coupled to the AGC module, that amplifies the received signal 153 based on the AGC signal 141 to produce an amplified received signal such as desired RF signal 154. It should be noted that AGC module 336 operates by responding to the signal strength, energy or power in the received signal to control the gain of the low noise amplifier 330 to a level that amplifies the signal, but avoids clipping or saturation of the low noise amplifier 330. AGC signal 141 can be an analog signal, a discrete time signal or a digital signal that is used by processing module 225 as discussed in conjunction with FIG. 5.

Figure 7:
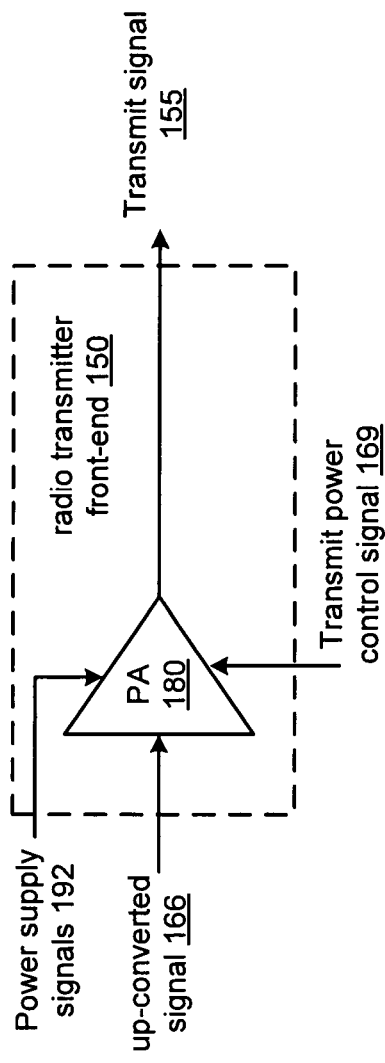
FIG. 7 is a schematic block diagram of an embodiment of a radio transmitter front-end in accordance with the present invention.

FIG. 7 is a schematic block diagram of an embodiment of a radio transmitter front-end in accordance with the present invention. In particular, radio transmitter front-end 150 is shown that includes a power amplifier 180 that produces transmit signal 155 from up-converted signal 166. In an embodiment of the present invention, power amplifier 180 includes at least one adjustable gain amplifier having a transmit gain that is based on the transmit power control signal 169. In this fashion, the power level of transmit signal 155 can be selected or adjusted to a desired level, based on the transmit power control signal 169. In a particular implementation, power amplifier 180 can operate at one of a plurality of power levels as selected by transmit power control signal 169. Further, power supply signals 192, can either be static or adjustable to one of a plurality of power modes to supply the necessary power to power amplifier 180 based on the selected power level.

For example, power amplifier 180 can operate in a plurality of power levels such as in a low, medium and high or to a greater number of levels. The supply voltage or current limit of power supply signals 192 can be modified by the power management circuit 95 or 95' and/or additional power supply signals 192 can be supplied, based on the selected mode of operation. A high current limit and/or high voltage can correspond to a high power mode. A medium current limit and/or medium supply voltage can correspond to the medium power mode. Further, a low current limit and/or low supply voltage can correspond to the low power mode.

Figure 8:
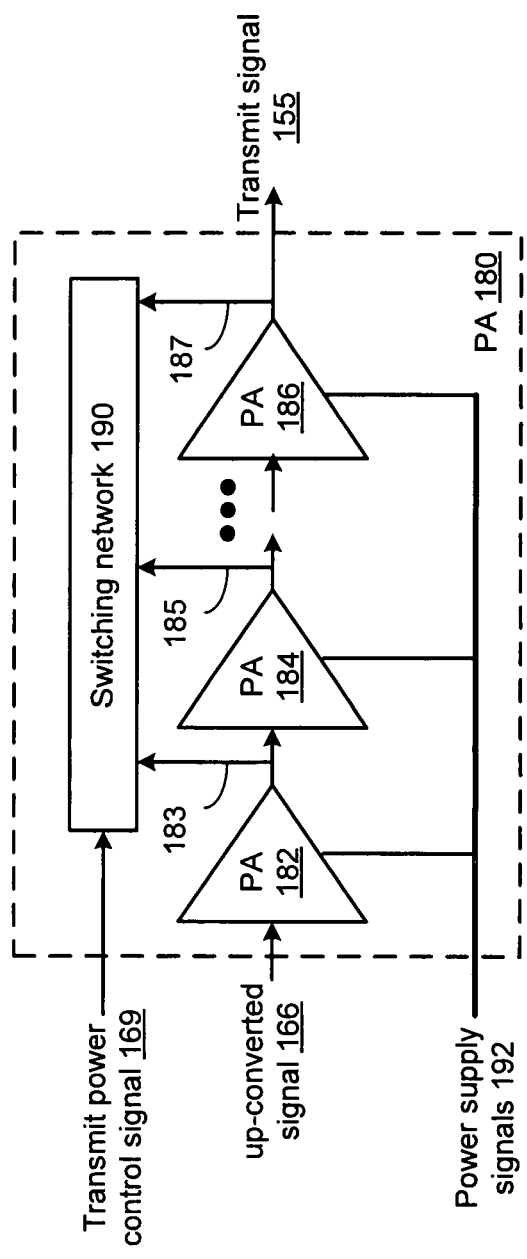
FIG. 8 is a schematic block diagram of an embodiment of a power amplifier in accordance with the present invention.

FIG. 8 is a schematic block diagram of an embodiment of a power amplifier in accordance with the present invention. In this embodiment power amplifier 180 is implemented with a plurality of separate power amplifier stages 182, 184, 186, etc. These series configured power amplifier stages are powered separately by power supply signals 192 that may have different supply voltage and/or current limits. A switching network 190 couples the transmit signal 155 from the power amplifiers 182, 184, 186, etc. in response to the transmit power control signal 169.

In a low power mode, power supply signals 192 supply power to only power amplifier 182 designed for low power operation) and not to power amplifiers 184 and 186, etc. The switching network 190 couples the output 183 of power amplifier 182 as the transmit signal 155. This reduces power consumption of the circuit in this low power mode. In a medium power mode, the output 183 of power amplifier 182 is amplified again by power amplifier 184 to produce output 185 that is coupled by switching network 190 as transmit signal 155. In this medium power mode, only power amplifiers 182 and 184 are fed power supply signals 192 from the power management circuit 95 or 95' with the other power amplifiers left unpowered. As can be seen, additional power modes can power more or all of the power amplifier stages to supply greater output power. Only those output stages in use are powered by power supply signals 192 in order to conserve power.

Figure 9:
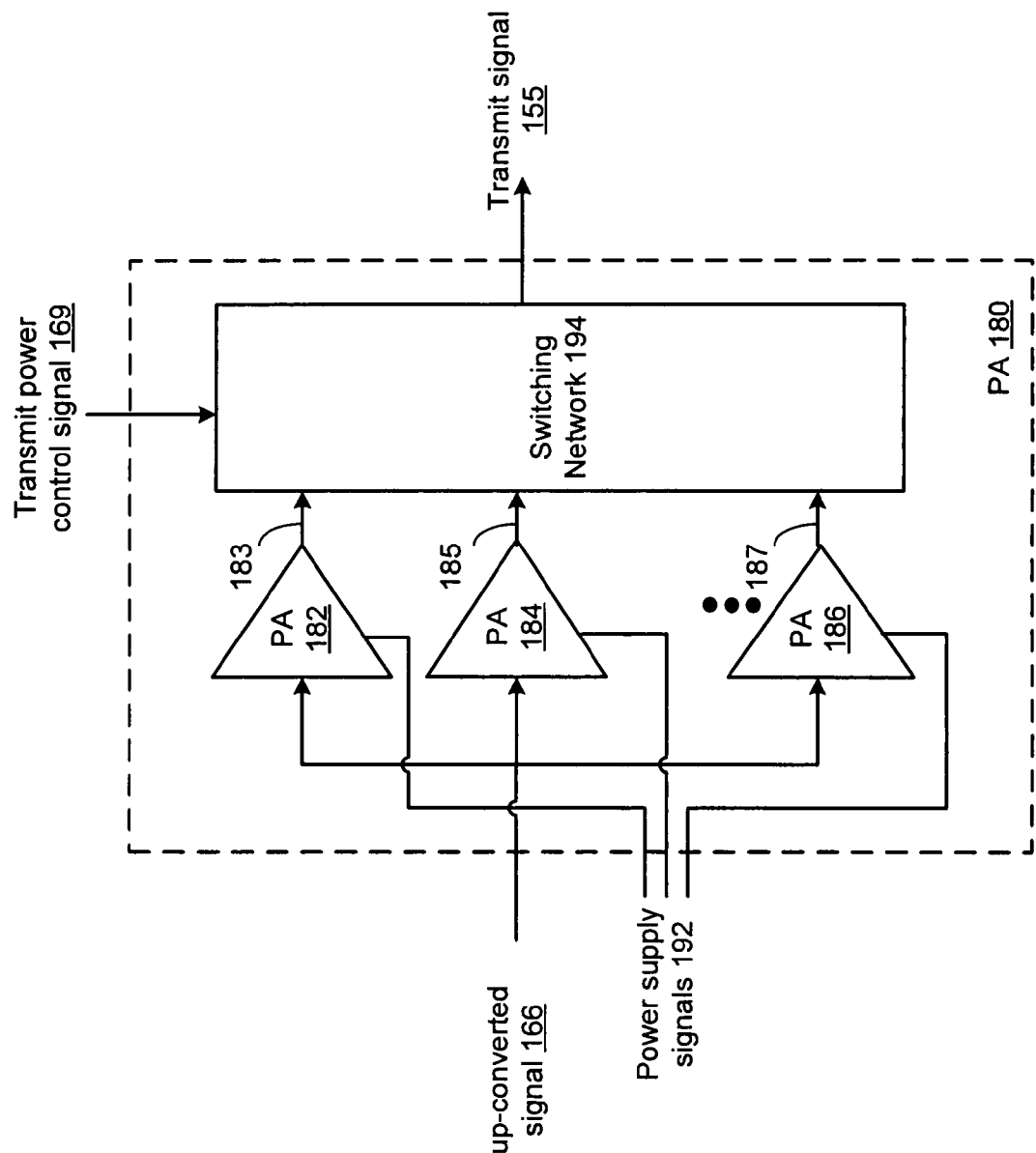
FIG. 9 is a schematic block diagram of an embodiment of another power amplifier in accordance with the present invention.

FIG. 9 is schematic block diagram of an embodiment of another power amplifier in accordance with the present invention. In this embodiment, a parallel configuration of power amplifiers 182, 184 and 186 are presented, each corresponding to a separate power level. For instance, power amplifier 182 can operate at a low power range of −50 to −15 db, power amplifier 184 can operate at a medium power range of −15 to +10 db and power amplifier 186 can operate at a high power range of +10 to +28 db. With each range corresponding to a separate power mode, the particular power mode can be selected based on the desired power range. In operation, the corresponding power amplifier is supplied power by the corresponding one of the power supply signals 192 (having a corresponding supply voltage and/or current limit) with its output coupled as transmit signal 155 by switching network 194. The other power amplifiers can be left unpowered in order to conserve power.

Figure 10:
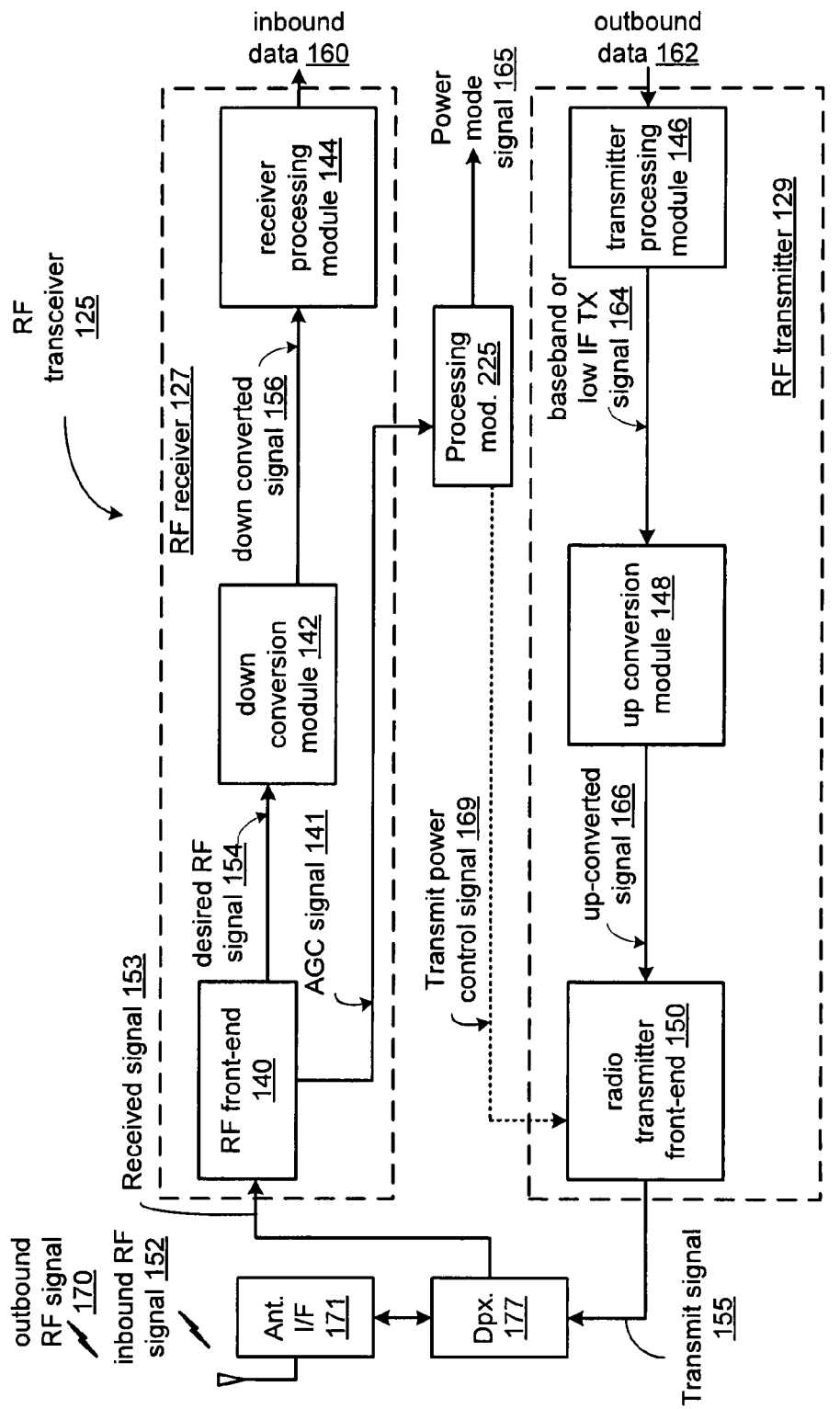
FIG. 10 is a schematic block diagram of another embodiment of an RF transceiver in accordance with the present invention.

FIG. 10 is a schematic block diagram of another embodiment of an RF transceiver in accordance with the present invention. In particular RF transceiver 125, such as transceiver 73 or 75, is shown in a further embodiment that includes similar elements that are referred to by common reference numerals. In this embodiment, processing module 225 optionally generates transmit power control signal 169 but also generates power mode signal 165, based on the AGC signal 141, that can be used for adjusting a power consumption parameter of the RF IC 50 or 70, such as a power supply voltage or current used generally or a specific power supply signal used in powering either the RF receiver 127 or the RF transmitter 129.

For instance, a lower power mode can be selected for the RF transmitter based 129 in the event that the AGC signal 141 indicates a strong received signal 153 from an external device corresponding to a desired lower power consumption and a lower power level for transmit signal 155. In addition, to reducing the transmit power level, one or more power consumption parameters of the power supply signals can be adjusted in response to power mode signal 165. In an example, power supply signals 192 can be adjusted by adding or removing a power supply signal, for instance, as discussed in conjunction with FIGS. 8 and 9. Further power supply signals 192 can be adjusting a power supply voltage or current to the appropriate transmit power level.

In addition or in the alternative, power consumption parameters of the RF receiver, the processor or other modules of RF IC 50 or 70 can be adjusted in response to power mode signal 165. For example, a power supply voltage or current used to power the RF receiver 127 can be adjusted based on the expected power consumption of the RF receiver 127 determined from the AGC signal 141.

In an embodiment of the present invention, the processing module 225 adjusts the power mode signal 165 based on the AGC signal 141. For instance, the processing module 225 can include hardware, firmware or software that, via a look-up table or algorithm, generates a power mode signal 165 corresponding to a desired power consumption parameters, based on the value of the AGC signal 141.

Figure 11:
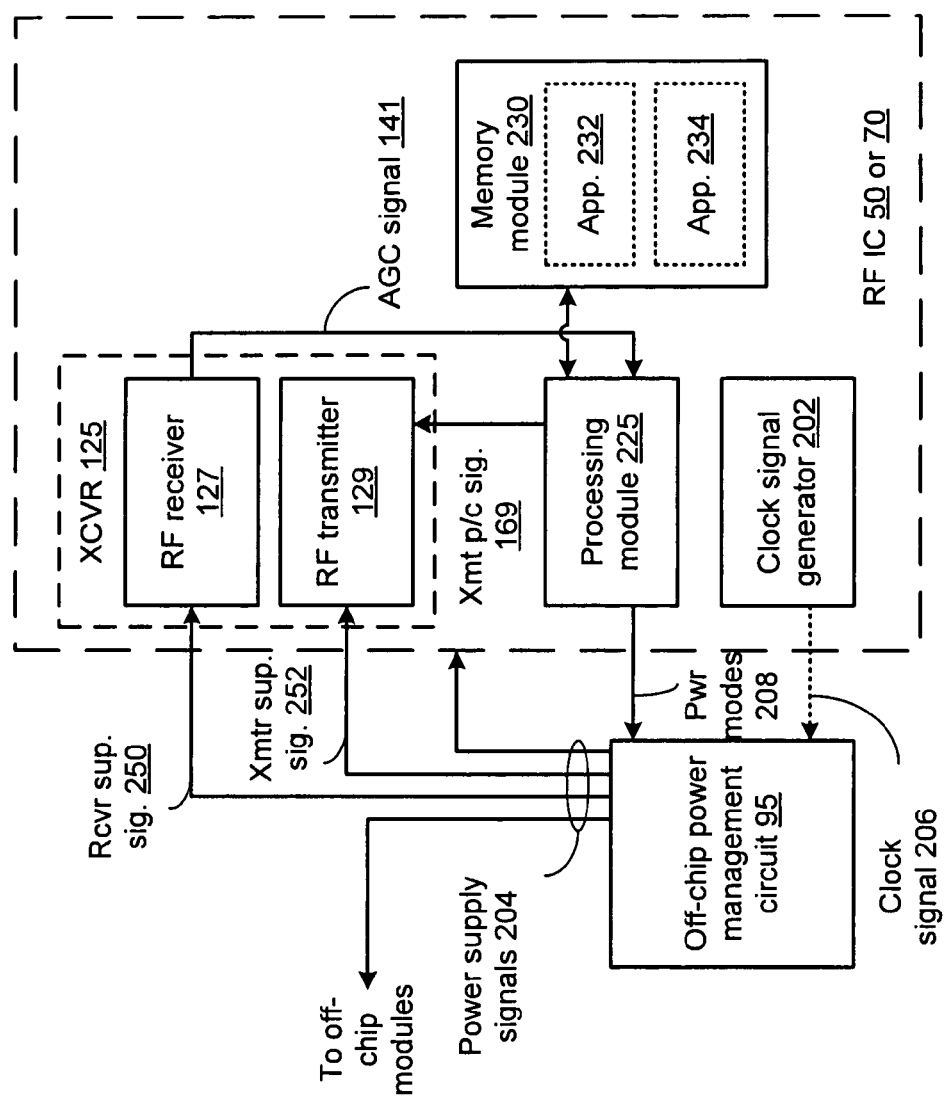
FIG. 11 is a schematic block diagram of an embodiment of power management circuitry in accordance with the present invention.

FIG. 11 is a schematic block diagram of an embodiment of power management circuitry in accordance with the present invention. In particular, selected modules of RF IC 50 or 70 are shown that include RF transceiver 125, processing module 225, memory module 230, and clock signal generator 202. In an embodiment of the present invention, memory module 230 stores a least one application, such as application 232 and/or application 234 that may include any of the applications discussed in conjunction with FIGS. 1-4, as well as other interface applications, system utilities, or other programs executed by processing module 225 to perform the functions and features of communication device 10 or 30. These applications are stored in memory module 230 and/or an off-chip memory such as memory 54, as a plurality of operational instructions.

Off-chip power management circuit 95 receives the power mode signal 165 as part of power mode signals 208 and generates a plurality of power supply signals 204 to power off-chip modules and on-chip modules as these modules are in use such as transmitter power supply signal 252 and receiver supply signal 250. As discussed in conjunction with FIG. 10, transmitter supply signal 252 and or receiver supply signal 250 can be adjusted based on the power mode signal 165 and the current power mode. For example, the various power modes of RF transmitter 129 can include a low, medium and high power ranges of power levels. Power mode signal 165, included in power mode signals 208, can inform the off-chip power management circuit of the selected power mode of the RF transmitter 129 so that off-chip power management circuit 95 can supply the necessary power supply signals 204 to meet the power demands of the selected mode of operation. This methodology allows power to be generated for the RF transmitter and/or the transmitter, only as required to address the current power mode in use.

Also, if communication device 10 or 30 is using certain peripheral devices and/or certain interfaces or modules at a given time, off-chip power management circuit 95 can be commanded to supply only those power supply signals 204 that are required based on the peripheral devices, interfaces and/or other modules that are in use. Further, if a USB device is coupled to wireline port 64, then a power mode command can be sent to off-chip power management module 95 to generate a power supply signal 204 that supplies a power supply voltage, (such as a 5 volt, 8 milliamp supply voltage) to the wireline port 64 in order to power the USB device or devices connected thereto. In another example, if the communication device 10 includes a mobile communication device that operates in accordance with a GSM or EDGE wireless protocol, the off-chip power management circuit 95 can generate supply voltages for the baseband and RF modules of the transceiver only when the transceiver is operating.

Further, peripheral devices, such as the camera 76, memory 54, keypad/keyboard 58, microphone 60, display 56, and speaker 62 can be powered when these peripheral devices are attached (to the extent that they can be detached) and to the extent that these devices are currently in use by the application.

The power management features of the present invention operate based on the processing module determining, for the current application being executed with corresponding current use characteristics, the current power mode of a plurality of power modes. In particular, processing module 225 when executing the application, can select a current power mode based on current use characteristics of the application as well as the AGC signal 141 and generate a power mode signal 208 based on the selected power modes. In an embodiment of the present invention, processing module 225 maintains a register that indicates for a plurality of modules, interfaces and/or peripheral devices either, whether that device is currently being used or a power flag, such as power off, power on, high power, low power, medium power, etc, for that particular device, module and/or interface (when these devices are themselves capable in operating in different power modes). In addition, processing module, via look-up table, calculation or other processing routine, determines power mode 208 by determining the particular power supply signals required to be generated based on the devices in use and optionally their own power states.

The off-chip power management circuit 95 can be implemented as a multi-output programmable power supply, that receives the power mode signal 208 and generates and optionally routes the power supply signals 204 to particular ports, pins or pads of RF IC 50 or 70 or directly to peripheral devices via a switch matrix, as commanded based on the power mode signal. In an embodiment of the present invention, the power mode signal 208 is decoded by the off-chip power management module to determine the particular power supply signals to be generated, and optionally—their characteristics such as voltage, current and/or current limit. As shown, RF IC 50 or 70 optionally generates a clock signal 206 via clock signal generator 202, or otherwise couples a clock signal 206 generated off-chip to the off-chip power management circuit 95. The off-chip power management circuit 95 operates based on the clock signal 206.

In an embodiment of the present invention, RF IC 50 or 70 couples the power mode signal 208 to the off-chip power management circuit 95 via one or more dedicated digital lines that comprise a parallel interface. Further, the RF IC 50 or 70 can couple the power mode signal 208 to the off-chip power management circuit via a serial communication interface such as an I²C interface, serial/deserializer (SERDES) interface or other serial interface.

Figure 12:
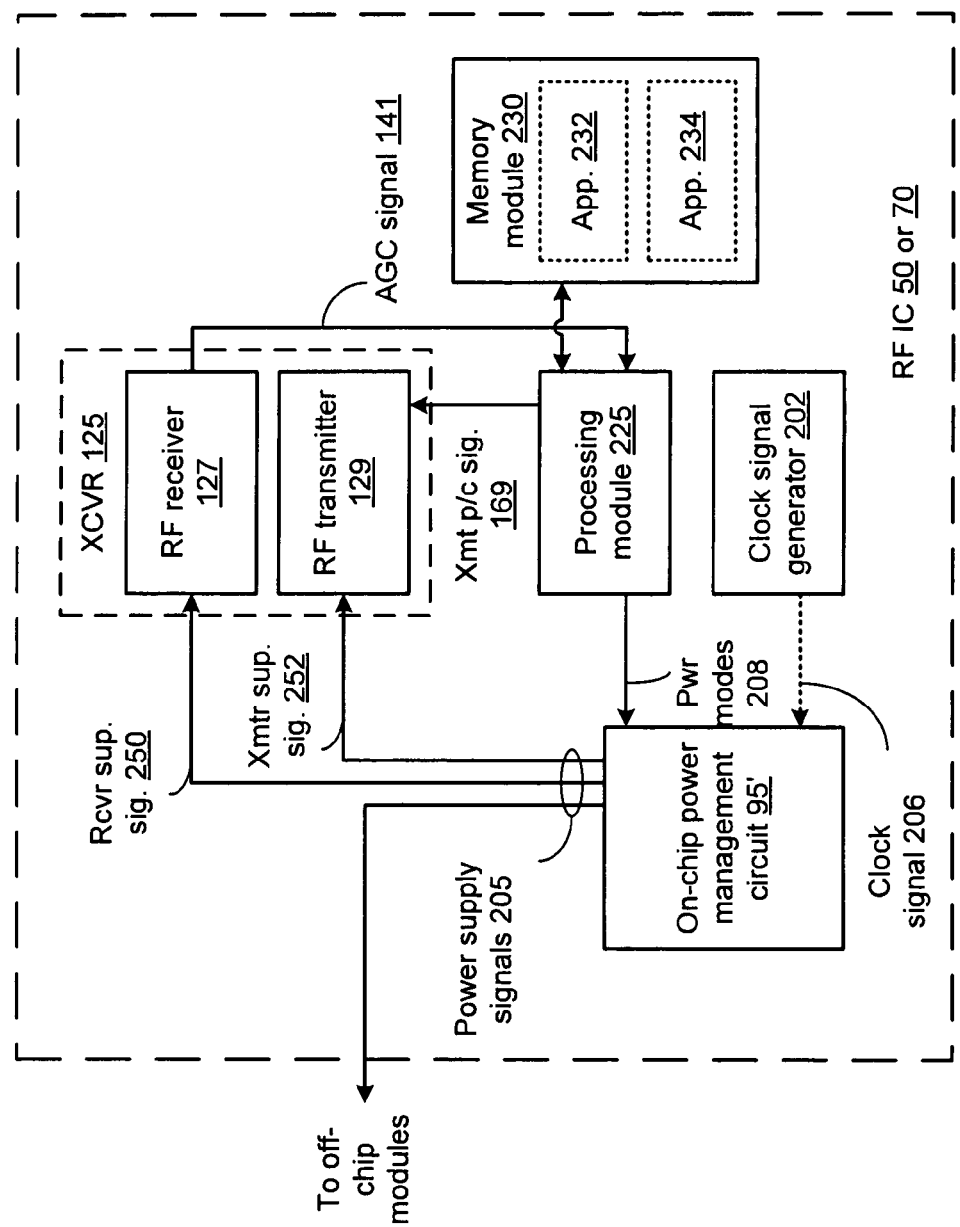
FIG. 12 is a schematic block diagram of another embodiment of power management circuitry in accordance with the present invention.

FIG. 12 is a schematic block diagram of another embodiment of power management circuitry in accordance with the present invention. This embodiment includes similar elements described in conjunction with FIG. 11 that are referred to by common reference numerals. In particular, on-chip power management circuit 95' includes one or more DC-DC converters, voltage regulators, current regulators or other power supplies for supplying the RF IC 50 or 70, and optionally the other components of communication device 10 and/or its peripheral devices with supply voltages and or currents (collectively power supply signals) that may be required to power these devices. On-chip power management circuit 95' can operate from one or more batteries, line power and/or from other power sources, not shown. In particular, on-chip power management module 95' can selectively supply power supply signals of different voltages, currents or current limits or with adjustable voltages, currents or current limits in response to power mode signals 208 received from processing module 225. In this fashion, on-chip power management circuit 95' operates as off-chip power management module 95, but on an on-chip basis.

Figure 13:
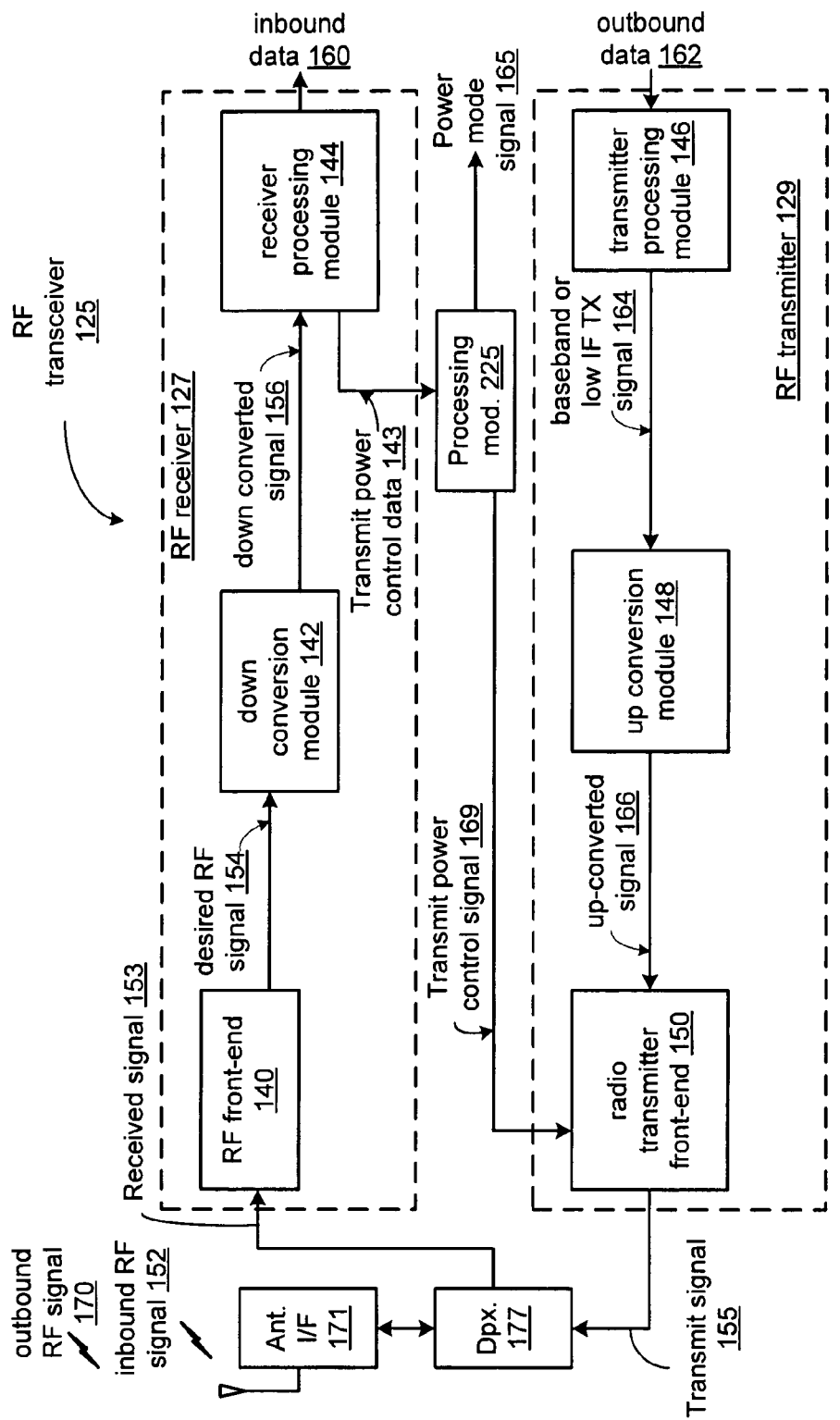
FIG. 13 is a schematic block diagram of another embodiment of an RF transceiver in accordance with the present invention.

FIG. 13 is a schematic block diagram of another embodiment of an RF transceiver in accordance with the present invention. In particular RF transceiver 125, such as transceiver 73 or 75, is shown in a further embodiment that includes similar elements that are referred to by common reference numerals. In this embodiment, processing module 225 generates transmit power control signal 169 and generates power mode signal 165, in response to transmit power control data 143 received via inbound RF signal 152 and received signal 153. In this fashion, an external device such as a base station, access point or other remote station can provide transmit power control data 143 to the RF transceiver in response to the operating environment of the RF transceiver, reception characteristics, etc.

Figure 14:
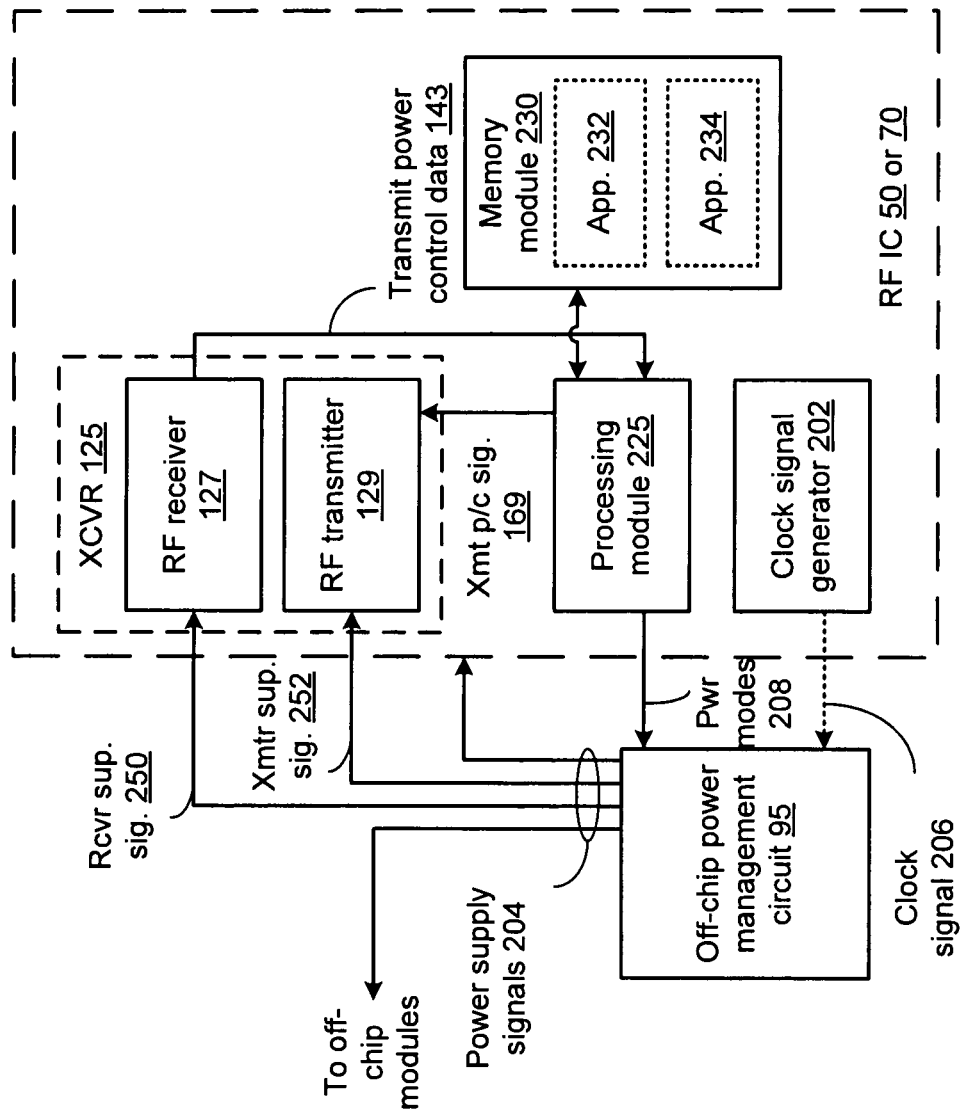
FIG. 14 is a schematic block diagram of another embodiment of power management circuitry in accordance with the present invention.

FIG. 14 is a schematic block diagram of another embodiment of power management circuitry in accordance with the present invention. This embodiment includes similar elements described in conjunction with FIG. 11 that are referred to by common reference numerals. In this embodiment however, power mode signals 208 include power mode signal 165 that is generated based on transmit power control data 143 received by receiver 127 from an external device. For instance, should the external device, based on its reception of signals from RF transceiver 125 and/or from other devices, determine that RF transceiver 125 should increase or decrease its transmit power or to cease transmitting altogether, the external device can generate transmit power control data 143 that is sent via inbound RF signal 152 to RF transceiver 125 as control data, payload data or other signaling. In response, RF transceiver 125 receives and decodes the transmit power control data 143 and processing module 225 generates transmit power control signal 169 that is sent to RF transmitter front end 150 to adjust the transmit power level and power mode signal 165 that is sent to the power management unit 95 or 95' to adjust the transmitter supply signal 252 in accordance with the particular transmit power level that has been selected.

Figure 15:
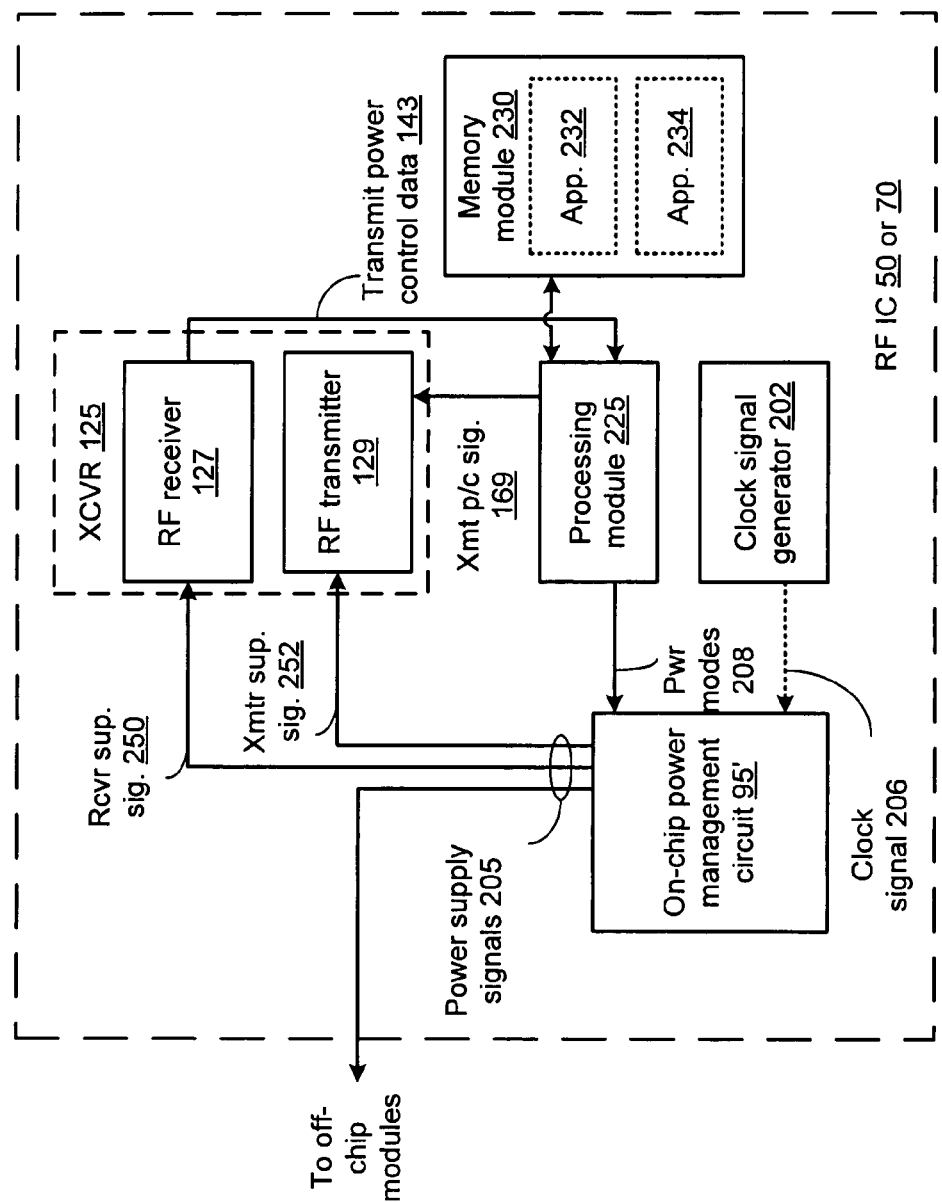
FIG. 15 is a schematic block diagram of another embodiment of power management circuitry in accordance with the present invention.

FIG. 15 is a schematic block diagram of another embodiment of power management circuitry in accordance with the present invention. This embodiment includes similar elements described in conjunction with FIGS. 12 and 14 that are referred to by common reference numerals. In particular, on-chip power management circuit 95' includes one or more DC-DC converters, voltage regulators, current regulators or other power supplies for supplying the RF IC 50 or 70, and optionally the other components of communication device 10 and/or its peripheral devices with supply voltages and or currents (collectively power supply signals) that may be required to power these devices. On-chip power management circuit 95' can operate from one or more batteries, line power and/or from other power sources, not shown as discussed in conjunction with FIG. 12.

Figure 16:
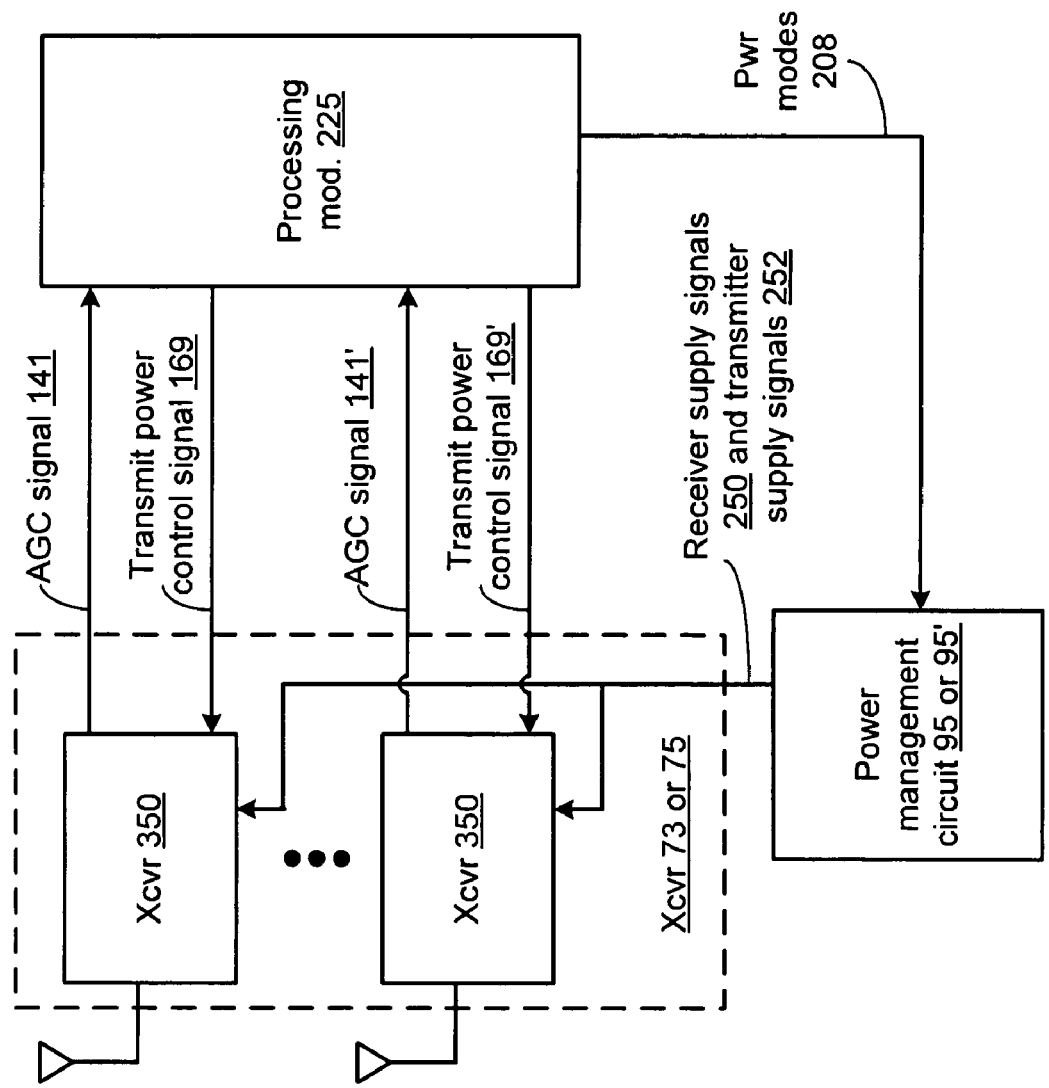
FIG. 16 is a schematic block diagram of another embodiment of an RF transceiver in accordance with the present invention.

FIG. 16 is a schematic block diagram of another embodiment of an RF transceiver in accordance with the present invention. In particular, a MIMO configuration is shown for transceiver 73 or 75 that includes multiple RF transceivers 350, such as RF transceiver 125, that transmits outbound data 162 via each transceiver 350 and that generates inbound data 160 by combining inbound data from each of the transceivers 350 via maximum ratio recombination or other processing technique. Each transceiver includes a RF transmitter, such as RF transmitter 129, and an RF receiver, such as RF receiver 127 that share a common antenna, that share a common antenna structure that includes multiple antennas or that that employ separate antennas for the transmitter and receiver. In this configuration, processing module 225 generates transmit power control signals 169, 169', etc. and power mode signals 208 based on AGC signals 141, 141', etc. received from each of the transceivers 350.

In an embodiment of the present invention, processing module 225 includes hardware, firmware or software to determine an AGC composite signal and to generate the power mode signal 165 of power mode signals 208 based on the AGC composite signal. For instance, the processing module 225 can compare the AGC signals 141, 141', etc. from each of the plurality of transceivers 350 and determine a lowest gain AGC signal that corresponds to a highest strength of the plurality of received signals received by the transceivers 350. In this example, the processing module can generate the power mode signal 165 based on the lowest gain AGC signal. In other examples, the processing module can generate the AGC composite signal based on the mean, median or mode of the AGC signals 141, 141' or via other combination or selection. Further, the processing module 225 can generate the transmit power control signal 169, 169', etc. to control the transmit power levels of the transceivers 350 to a single common value, based on the composite AGC signal. In this fashion, each transceiver 350 transmits at the same power level, and have the same power consumption parameters, based on the highest gain received signal, or some averaging of the AGC signals 141, 141', etc.

In another embodiment of the present invention, the processing module selects transmit power levels and power consumption parameters for the transceivers 350 independently, based on the individual AGC signal 141 or 141' of that particular transceiver. In other words, the independent values of the power level selected for the RF transmitter of each of the plurality of transceivers 350 are based on the AGC signal 141, 141', etc. from the RF receivers from the same RF transceiver. For example, if AGC signal 141 corresponds to a medium signal strength and AGC signal 141' corresponds to a high signal strength, transmit power control signal 169 can be chosen to correspond to a medium power level and transmit power control signal 169' can be chosen to correspond to a high power level, with power mode signals 208 controlling the transmitter supply signals 252 individually to the transceivers 350 in a fashion to supply the voltage and current necessary to operate at these two power levels.

Figure 17:
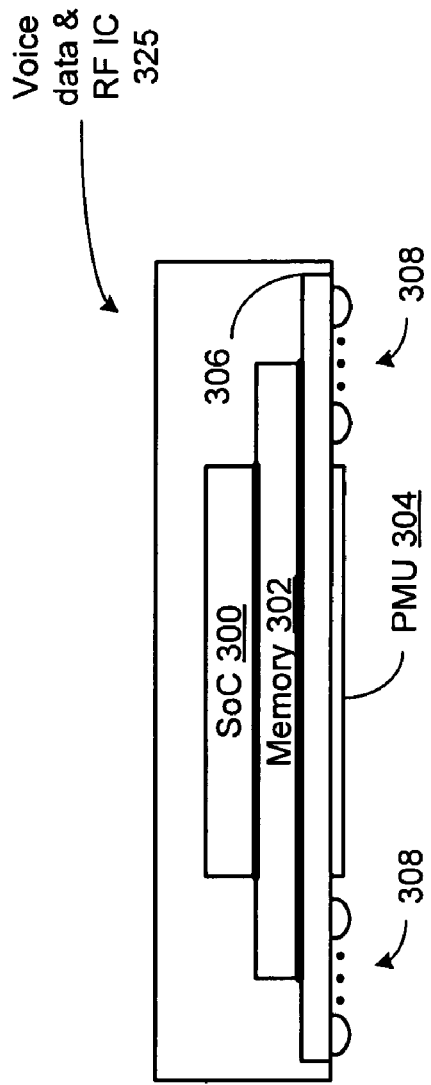
FIG. 17 is a side view of a pictorial representation of an integrated circuit package in accordance with the present invention.

FIG. 17 is a side view of a pictorial representation of an embodiment of an integrated circuit package in accordance with the present invention. Voice data and RF IC 325, such as RF IC 50 or 70, includes a system on a chip (SoC) die 300, a memory die 302 a substrate 306, bonding pads 308 and power management unit (PMU) 308, such as on-chip power management circuit 95'. This figure is not drawn to scale, rather it is meant to be a pictorial representation that illustrates the juxtaposition of the SoC die 300, memory die 302, PMU 304 and the bonding pads 308. In particular, the voice data and RF IC 325 is integrated in a package with a top and a bottom having a plurality of bonding pads 308 to connect the voice data and RF IC 325 to a circuit board, and wherein the on-chip power management unit 325 is integrated along the bottom of the package. In an embodiment of the present invention, die 302 includes the memory module 230 and die 300 includes the processing module 225. These dies are stacked and die bonding is employed to connect these two circuits and minimize the number of bonding pads, (balls) out to the package.

Both SoC die 300 and memory die 302 are coupled to respective ones of the bonding pads 308 via bonding wires or other connections.

PMU 304 is coupled to the SoC die 300, and/or the memory die 302 via conductive vias, bonding wires, bonding pads or by other connections. The positioning of the PMU on the bottom of the package in a flip chip configuration allows good heat dissipation of the PMU 304 to a circuit board when the voice data and RF integrated circuit is installed.

Figure 18:
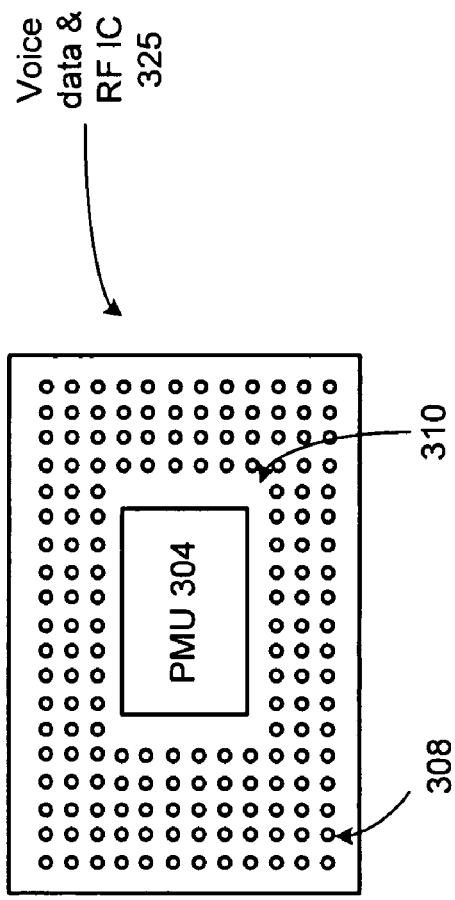
FIG. 18 is a bottom view of a pictorial representation of an integrated circuit package in accordance with the present invention.

FIG. 18 is a bottom view of a pictorial representation of an embodiment of an integrated circuit package in accordance with the present invention. As shown, the bonding pads (balls) 308 are arrayed in an area of the bottom of the integrated circuit with an open center portion 310 and wherein the on-chip power management unit (PMU 304) is integrated in the open center portion. While a particular pattern and number of bonding pads 308 are shown, a greater or lesser number of bonding pads can likewise be employed with alternative configurations within the broad scope of the present invention.

Figure 19:
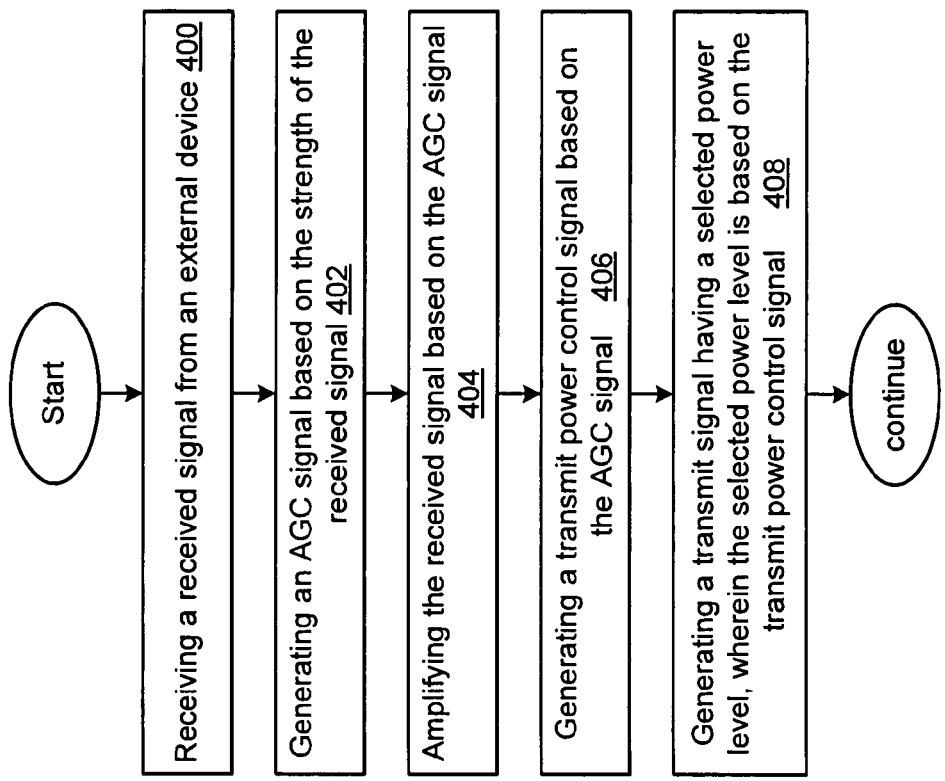
FIG. 19 is a flow chart of an embodiment of a method in accordance with the present invention.

FIG. 19 is a flow chart of an embodiment of a method in accordance with the present invention. In particular, a method is presented for use in conjunction with one or more of the functions and features described in conjunction with FIGS. 1-18. In step 400, a received signal is received from an external device. In step 402, an automatic gain control (AGC) signal is generated based on a strength of the received signal. In step 404, the received signal is amplified based on the AGC signal. In step 406, a transmit power control signal is generated based on the AGC signal. In step 408, a transmit signal is generated at a selected power level, wherein the selected power level is based on the transmit power control signal.

In an embodiment of the present invention, step 406 can include comparing the AGC signal to a plurality of thresholds. Step 408 can include adjusting a transmit gain of at least one adjustable gain amplifier based on the transmit power control signal, selecting at least one of a plurality of series configured power amplifiers based on the transmit power control signal or selecting at least one of a plurality of parallel configured power amplifiers based on the transmit power control signal and can operate in accordance with at least one of, a wireless local area network protocol, a pico area network protocol, a wireless telephony protocol, and a wireless data protocol. Step 400 can operate in accordance with at least one of, a wireless local area network protocol, a pico area network protocol, a wireless telephony protocol, and a wireless data protocol.

Figure 20:
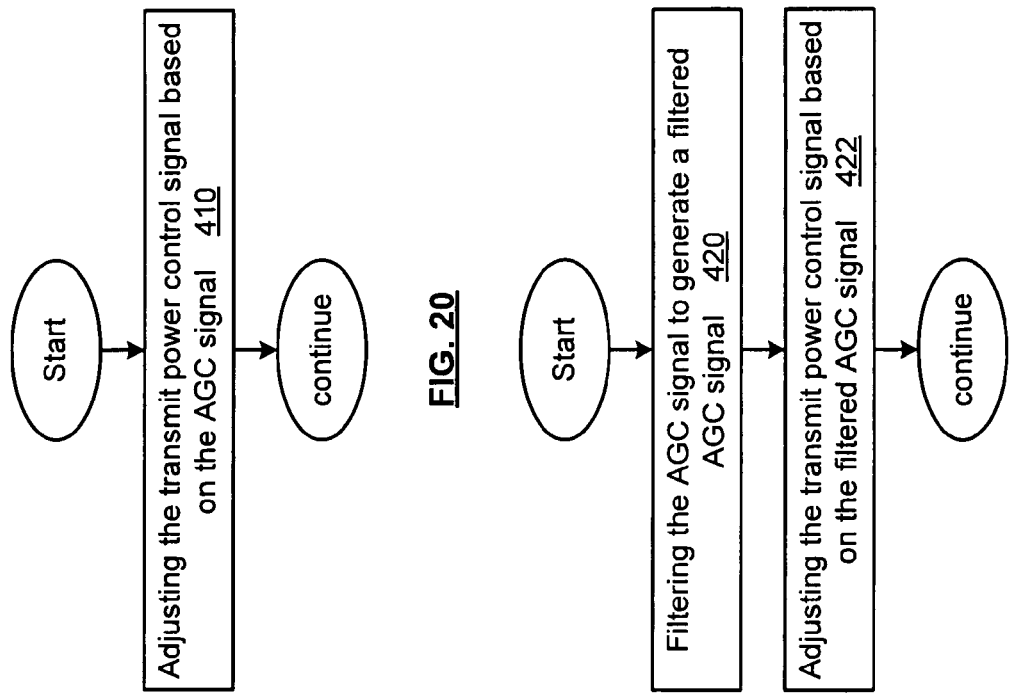
FIG. 20 is a flow chart of an embodiment of a method in accordance with the present invention.

FIG. 20 is a flow chart of an embodiment of a method in accordance with the present invention. In particular, a method is presented for use in conjunction with one or more of the functions and features described in conjunction with FIG. 19. In step 410, the transmit power control signal is adjusted based on the AGC signal.

Figure 21:
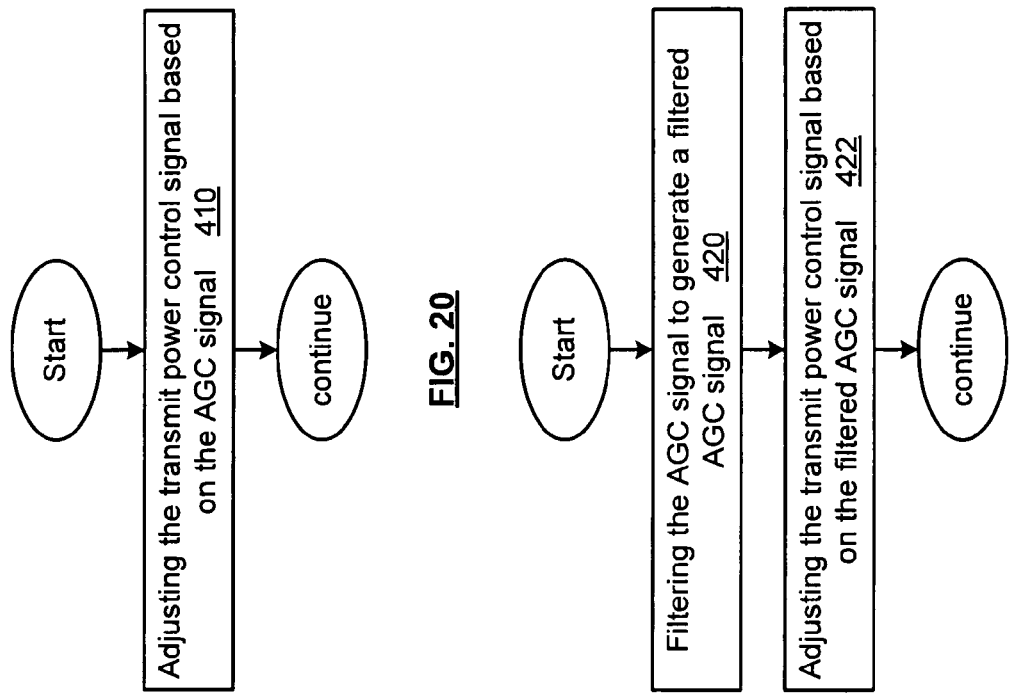
FIG. 21 is a flow chart of an embodiment of a method in accordance with the present invention.

FIG. 21 is a flow chart of an embodiment of a method in accordance with the present invention. In particular, a method is presented for use in conjunction with one or more of the functions and features described in conjunction with FIGS. 19-20. In step 420, the AGC signal is filtered to generate a filtered AGC signal. In step 422, the transmit power control signal is adjusted in response to the filtered AGC signal.

Figure 22:
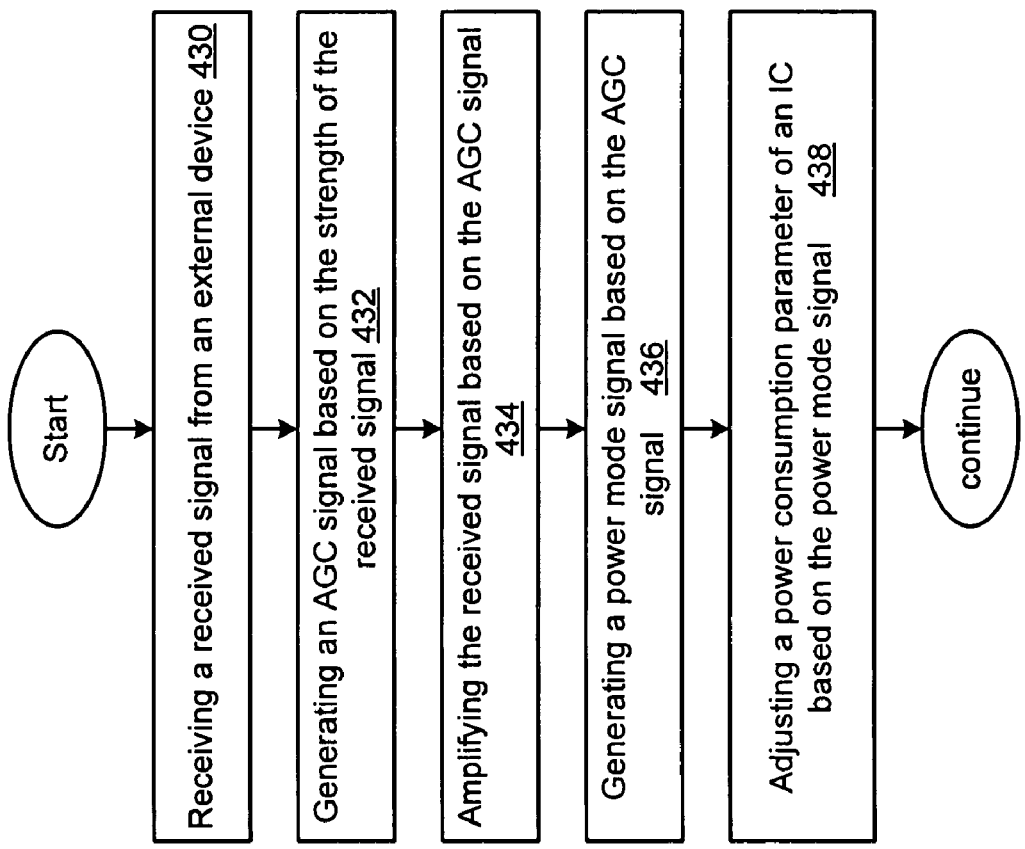
FIG. 22 is a flow chart of an embodiment of a method in accordance with the present invention.

FIG. 22 is a flow chart of an embodiment of a method in accordance with the present invention. In particular, a method is presented for use in conjunction with one or more of the functions and features described in conjunction with FIGS. 1-21. In step 430, a received signal is received from an external device. In step 432, an automatic gain control (AGC) signal is generated based on a strength of the received signal. In step 434, the received signal is amplified based on the AGC signal. In step 436, a power mode signal is generated based on the AGC signal. In step 438, a power consumption parameter of an IC is adjusted, based on the power mode signal.

In an embodiment of the present invention, step 438 can include generating a plurality of power supply signals based on the power mode signal, generating an additional transmitter power supply signal, generating a first transmitter power supply signal having a first current limit in response to a first value of the power mode signal, and a second transmitter power supply signal having a second current limit in response to a second value of the power mode signal and/or generating a first transmitter power supply signal having a first supply voltage in response to a first value of the power mode signal, and a second transmitter power supply signal having a second supply voltage in response to a second value of the power mode signal. The power consumption parameter can include a power supply voltage and/or a power supply current.

Step 436 can include comparing the AGC signal to a plurality of thresholds and/or filtering the AGC signal to generate a filtered AGC signal and adjusting the power mode signal in response to the filtered AGC signal.

Step 430 can selectively operate in accordance with at least two of, a wireless local area network protocol, a pico area network protocol, a wireless telephony protocol, and a wireless data protocol.

Figure 23:
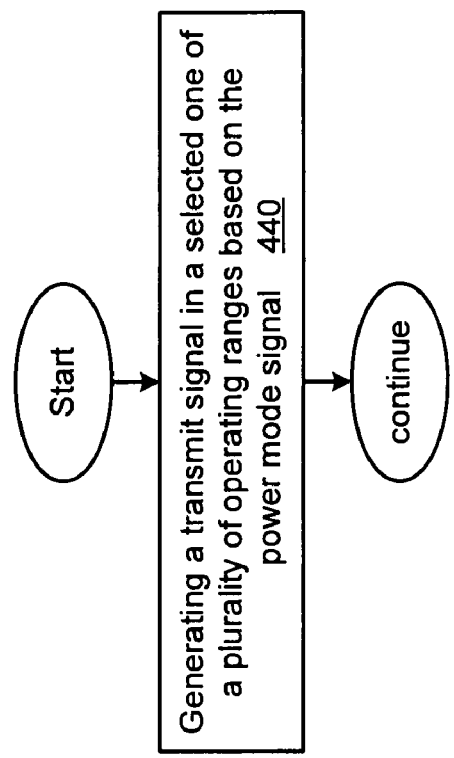
FIG. 23 is a flow chart of an embodiment of a method in accordance with the present invention.

FIG. 23 is a flow chart of an embodiment of a method in accordance with the present invention. In particular, a method is presented for use in conjunction with one or more of the functions and features described in conjunction with FIG. 22. In step 440, a transmit signal is generated in a selected one of a plurality of operating ranges based on the power mode signal.

FIG. 24 is a flow chart of an embodiment of a method in accordance with the present invention. In particular, a method is presented for use in conjunction with one or more of the functions and features described in conjunction with FIGS. 1-23. In step 450, a transmit signal is transmitted at a selectable transmit power, based on a transmit power control signal. In step 452, a received signal is received from an external device, the received signal including transmit power control data. In step 454, the transmit power control signal is generated based on the transmit power control data. In step 456 a power mode signal is generated based on the transmit power control data. In step 458, a power consumption parameter of at least one of, an RF receiver and an RF transmitter, is generated based on the power mode signal.

In an embodiment of the present invention the power consumption parameter includes a power supply voltage and/or power supply current. Step 458 can include generating a first transmitter power supply signal having a first current limit in response to a first value of the power mode signal, and a second transmitter power supply signal having a second current limit in response to a second value of the power mode signal, generating a first transmitter power supply signal having a first supply voltage in response to a first value of the power mode signal, and a second transmitter power supply signal having a second supply voltage in response to a second value of the power mode signal, generating a first receiver power supply signal having a first current limit in response to a first value of the power mode signal, and a second receiver power supply signal having a second current limit in response to a second value of the power mode signal, and/or generating a first receiver power supply signal having a first supply voltage in response to a first value of the power mode signal, and a second receiver power supply signal having a second supply voltage in response to a second value of the power mode signal.

Step 452 can operate in accordance with at least one of, a wireless local area network protocol, a pico area network protocol, a wireless telephony protocol, and a wireless data protocol.

FIG. 25 is a flow chart of an embodiment of a method in accordance with the present invention. In particular, a method is presented for use in conjunction with one or more of the functions and features described in conjunction with FIGS. 1-24. In step 460, a received signal is received using an RF receiver. In step 462, an automatic gain control (AGC) signal is generated based on a strength of the received signal. In step 464, the received signal is amplified based on the AGC signal. In step 466, a power mode signal is generated based on the AGC signal. In step 468, a transmit signal is generated using an RF transmitter. In step 469, a power consumption parameter of at least one of, an RF receiver and an RF transmitter, is adjusted based on the power mode signal.

In an embodiment of the present invention, the power consumption parameter includes a power supply voltage and/or a power supply current. Step 469 can include generating a first transmitter power supply signal having a first current limit in response to a first value of the power mode signal, and a second transmitter power supply signal having a second current limit in response to a second value of the power mode signal, generating a first transmitter power supply signal having a first supply voltage in response to a first value of the power mode signal, and a second transmitter power supply signal having a second supply voltage in response to a second value of the power mode signal, generating a first receiver power supply signal having a first current limit in response to a first value of the power mode signal, and a second receiver power supply signal having a second current limit in response to a second value of the power mode signal, and/or generating a first receiver power supply signal having a first supply voltage in response to a first value of the power mode signal, and a second receiver power supply signal having a second supply voltage in response to a second value of the power mode signal.

Step 460 can operate in accordance with at least one of, a wireless local area network protocol, a pico area network protocol, a wireless telephony protocol, and a wireless data protocol.

FIG. 26 is a flow chart of an embodiment of a method in accordance with the present invention. In particular, a method is presented for use in conjunction with one or more of the functions and features described in conjunction with FIGS. 1-25. In step 470, a plurality of received signals are received. In step 472, a plurality of automatic gain control (AGC) signals are generated, wherein each of the plurality of automatic gain control (AGC) signals is based on a strength for a corresponding one of the plurality of received signals. In step 474, each of the plurality of received signals are amplified based on a corresponding one of the plurality of AGC signals. In step 476, a power mode signal is generated based on the plurality of AGC signals. In step 478, a power consumption parameter of an IC is adjusted based on the power mode signal.

In an embodiment of the present invention, step 478 can include includes generating a plurality of power supply signals based on the power mode signal, generating at least one transmitter power supply signal in response to the power mode signal, generating an additional transmitter power supply signal in response to the power mode signal, generating a first transmitter power supply signal having a first current limit in response to a first value of the power mode signal, and a second transmitter power supply signal having a second current limit in response to a second value of the power mode signal, and/or generating a first transmitter power supply signal having a first supply voltage in response to a first value of the power mode signal, and a second transmitter power supply signal having a second supply voltage in response to a second value of the power mode signal.

The power consumption parameter can include a power supply voltage and/or a power supply current. Step 476 can include comparing the plurality of AGC signals, determining a lowest gain AGC signal, from the plurality of AGC signals, that corresponds to a highest strength of the corresponding one of the plurality of received signals, and generating the power mode signal based on the lowest gain AGC signal. Step 476 can include determining an AGC composite signal from the plurality of AGC signals, generating the power mode signal based on the AGC composite signal. The AGC composite signal can include one of, a mode of the plurality of AGC signals, a median of the plurality of AGC signals, and a mean of the plurality of AGC signals.

FIG. 27 is a flow chart of an embodiment of a method in accordance with the present invention. In particular, a method is presented for use in conjunction with one or more of the functions and features described in conjunction with FIGS. 1-26. In step 480 a plurality of received signals are received. In step 482, a plurality of automatic gain control (AGC) signals are generated, wherein each of the plurality of automatic gain control (AGC) signals is based on a strength for a corresponding one of the plurality of received signals. In step 484, each of the plurality of received signals are amplified based on a corresponding one of the plurality of AGC signals. In step 486, a transmit power control signal is generated based on the plurality of AGC signals. In step 488, a plurality of transmit signals are generated, each having a selected power level, wherein the selected power level of each of the plurality of transmit signals is based on the transmit power control signal.

Step 486 can include comparing the plurality of AGC signals, determining a lowest gain AGC signal, from the plurality of AGC signals, that corresponds to a highest strength of the corresponding one of the plurality of received signals, and generating the transmit power control signal based on the lowest gain AGC signal. Step 486 can include comparing the lowest gain AGC signal to a plurality of thresholds. Step 486 can include determining an AGC composite signal from the plurality of AGC signals, generating the transmit power control signal based on the AGC composite signal. The AGC composite signal can include one of, a mode of the plurality of AGC signals, a median of the plurality of AGC signals, and a mean of the plurality of AGC signals.

Step 486 can include comparing the composite AGC signal to a plurality of thresholds. The transmit power control signal can controls the selected power level of each of the plurality of transmit signals to a common value. The transmit power control signal can include a plurality of individual transmit power control signals that control the selected power level of each of the plurality of transmit signals to independent values.

Step 486 can include filtering each of the plurality of AGC signals to generate a corresponding plurality of filtered AGC signals, and the method can further include adjusting the transmit power control based on the plurality of filtered AGC signals.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. An integrated circuit (IC) comprising:
 an RF receiver that receives a received signal from an external device, the RF receiver including:
  an AGC module that generates an automatic gain control (AGC) signal based on a strength of the received signal; and a low noise amplifier, coupled to the AGC module, that amplifies the received signal based on the AGC signal;

a processing module, coupled to RF receiver, that generates a power mode signal based on the AGC signal, the power mode signal for adjusting a power consumption parameter of the IC based on the power mode signal; and a power management circuit, coupled to the processing module, that adjusts a power consumption parameter of the RF receiver based on the power mode signal.

2. The IC of claim 1 wherein the power management circuit generates a plurality of power supply signals including a receiver supply signal, and wherein the power consumption parameter is a parameter of the receiver supply signal.

3. The IC of claim 1 wherein an power management circuit adjusts the power consumption parameter of the IC based on the power mode signal.

4. The IC of claim 1 wherein the power consumption parameter includes a power supply voltage.

5. The IC of claim 1 wherein the power consumption parameter includes a power supply current.

6. The IC of claim 1 further comprising:
an RF transmitter, coupled to the processing module, that generates a transmit signal, the RF transmitter having a plurality of operating power ranges and that operates in a selected one of the plurality of operating ranges based on the power mode signal and that operates from at least one transmitter power supply signal generated by a power management circuit in response to the power mode signal.

7. The IC of claim 6 wherein the power management circuit generates an additional transmitter power supply signal in response to the power mode signal.

8. The IC of claim 6 wherein the power management circuit generates a first transmitter power supply signal having a first current limit in response to a first value of the power mode signal, and a second transmitter power supply signal having a second current limit in response to a second value of the power mode signal.

9. The IC of claim 6 wherein the power management circuit generates a first transmitter power supply signal having a first supply voltage in response to a first value of the power mode signal, and a second transmitter power supply signal having a second supply voltage in response to a second value of the power mode signal.

10. The IC of claim 1 wherein the processing module generates the power mode signal by comparing the AGC signal to a plurality of thresholds.

11. The IC of claim 1 wherein the processing module filters the AGC signal to generate a filtered AGC signal and adjusts the power mode signal in response to the filtered AGC signal.

12. The IC of claim 1 wherein the RF receiver selectively operates in accordance with at least two of, a wireless local area network protocol, a pico area network protocol, a wireless telephony protocol, and a wireless data protocol.

13. A method comprising:
receiving a received signal from an external device;
generating an automatic gain control (AGC) signal based on a strength of the received signal;
amplifying the received signal based on the AGC signal;
generating a power mode signal, based on the AGC signal;
adjusting a power consumption parameter of an IC, based on the power mode signal; and
generating a transmit signal in a selected one of a plurality of operating ranges based on the power mode signal.

14. The method of claim 13 wherein adjusting the power consumption parameter of an IC includes generating a plurality of power supply signals based on the power mode signal.

15. The method of claim 13 wherein the power consumption parameter includes a power supply voltage.

16. The method of claim 13 wherein the power consumption parameter includes a power supply current.

17. The method of claim 13 wherein adjusting the power consumption parameter of an IC includes generating at least one transmitter power supply signal in response to the power mode signal.

18. The method of claim 13 wherein adjusting the power consumption parameter of an IC includes generating an additional transmitter power supply signal in response to the power mode signal.

19. The method of claim 13 wherein adjusting the power consumption parameter of an IC includes generating a first transmitter power supply signal having a first current limit in response to a first value of the power mode signal, and a second transmitter power supply signal having a second current limit in response to a second value of the power mode signal.

20. The method of claim 13 wherein adjusting the power consumption parameter of an IC includes generating a first transmitter power supply signal having a first supply voltage in response to a first value of the power mode signal, and a second transmitter power supply signal having a second supply voltage in response to a second value of the power mode signal.

21. The method of claim 13 wherein generating the power mode includes comparing the AGC signal to a plurality of thresholds.

22. The method of claim 13 wherein generating the power mode includes filtering the AGC signal to generate a filtered AGC signal and adjusts the power mode signal in response to the filtered AGC signal.

23. The method of claim 13 wherein receiving the received signal selectively operates in accordance with at least two of, a wireless local area network protocol, a pico area network protocol, a wireless telephony protocol, and a wireless data protocol.

* * * * *

UNITED STATES PATENT AND TRADEMARK OFFICE
CERTIFICATE OF CORRECTION

| | | |
|---|---|---|
| PATENT NO. | : 7,787,849 B2 | Page 1 of 1 |
| APPLICATION NO. | : 11/848527 | |
| DATED | : August 31, 2010 | |
| INVENTOR(S) | : A. Rofougaran | |

It is certified that error appears in the above-identified patent and that said Letters Patent is hereby corrected as shown below:

Col. 19, line 4, in Claim 1: after "coupled to" insert --the--
Col. 19, line 15, in Claim 3: replace "an" with --a--

Signed and Sealed this
Eighth Day of May, 2012

David J. Kappos
*Director of the United States Patent and Trademark Office*